US010910605B2

(12) United States Patent
Bae et al.

(10) Patent No.: US 10,910,605 B2
(45) Date of Patent: Feb. 2, 2021

(54) DISPLAY DEVICE AND METHOD OF MANUFACTURING THE SAME

(71) Applicant: Samsung Display Co., Ltd., Yongin-si (KR)

(72) Inventors: Joon Hwa Bae, Suwon-si (KR); Hyun Jin Cho, Seoul (KR); Byoung Kwon Choo, Hwaseong-si (KR); Woo Jin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/883,780

(22) Filed: May 26, 2020

(65) Prior Publication Data

US 2020/0287171 A1     Sep. 10, 2020

Related U.S. Application Data

(62) Division of application No. 16/007,788, filed on Jun. 13, 2018, now Pat. No. 10,700,310.

(30) Foreign Application Priority Data

Nov. 23, 2017   (KR) ........................ 10-2017-0156903

(51) Int. Cl.
| H01L 51/56 | (2006.01) |
| H01L 27/32 | (2006.01) |
| H01L 27/12 | (2006.01) |
| H01L 51/52 | (2006.01) |

(52) U.S. Cl.
CPC .......... *H01L 51/56* (2013.01); *H01L 27/1255* (2013.01); *H01L 27/1259* (2013.01); *H01L 27/3246* (2013.01); *H01L 27/3248* (2013.01); *H01L 27/3258* (2013.01); *H01L 27/1248* (2013.01); *H01L 27/3262* (2013.01); *H01L 27/3265* (2013.01); *H01L 51/5206* (2013.01); *H01L 51/5221* (2013.01); *H01L 51/5256* (2013.01); *H01L 2227/323* (2013.01)

(58) Field of Classification Search
USPC .................................................. 257/40, 438
IPC .......... H01L 27/1255,27/3246, 51/56, 27/3248, 27/1259, 27/3258, 27/3262, 27/1248, 2227/323, 51/5206, 51/5256, 27/3265, 51/5221
See application file for complete search history.

(56) References Cited

U.S. PATENT DOCUMENTS

| 9,711,648 | B1 | 7/2017 | Leobandung et al. |
| 2006/0211181 | A1 | 9/2006 | Chung |
| 2013/0168647 | A1 | 7/2013 | Diekmann et al. |
| 2017/0207100 | A1* | 7/2017 | Park .................... H01L 21/8258 |

FOREIGN PATENT DOCUMENTS

KR     10-1152134 B1    6/2012

* cited by examiner

*Primary Examiner* — Hrayr A Sayadian
(74) *Attorney, Agent, or Firm* — Lewis Roca Rothgerber Christie LLP

(57) ABSTRACT

In a method of manufacturing a display device, the method includes: forming a conductive layer on a base; forming an organic layer, with a hole partially exposing the conductive layer, on the conductive layer; polishing an upper surface of the organic layer; and forming a light emitting element on the polished organic layer.

5 Claims, 26 Drawing Sheets

DISPLAY DEVICE AND METHOD OF MANUFACTURING THE SAME

CROSS-REFERENCE TO RELATED APPLICATIONS

This application is a divisional of U.S. patent application Ser. No. 16/007,788, filed Jun. 13, 2018, which claims priority to and the benefit of Korean Patent Application No. 10-2017-0156903, filed Nov. 23, 2017, the entire content of both of which is incorporated herein by reference.

BACKGROUND

1. Field

Aspects of some example embodiments of the present invention relate to a display device and a method of manufacturing the same.

2. Description of the Related Art

With the development of multimedia, display devices are becoming increasingly important. Accordingly, various display devices such as liquid crystal displays and organic light emitting displays are being developed.

For example, an organic light emitting display includes a base and an organic light emitting element arranged on the base. The organic light emitting element may include two opposite electrodes and an organic light emitting layer interposed between the two opposite electrodes. Electrons and holes provided from the two electrodes may be recombined in the organic light emitting layer to generate excitons, and the generated excitons may emit light as they change from an excited state to a ground state.

Because the organic light emitting display includes the organic light emitting element controlled in each pixel, it can be configured as a thin and lightweight display device with low power consumption. In addition, due to its characteristics such as wide viewing angle, high luminance and contrast and fast response speed, the organic light emitting display is drawing attention as a next-generation display device.

The above information disclosed in this Background section is only for enhancement of understanding of the background and therefore it may contain information that does not constitute prior art.

SUMMARY

An organic light emitting display may include driving elements such as a plurality of transistors, wirings, and/or auxiliary electrodes for controlling and driving the organic light emitting element in each pixel. The driving elements such as the transistors may be arranged on the base to form steps. If the steps formed by the driving elements such as the transistors are not sufficiently compensated, it may be difficult to control the thickness of the organic light emitting element, for example, the thickness of the organic light emitting layer. Therefore, the luminance of light emitted from the organic light emitting element may not be uniform, or the steps may be visible from the outside.

Aspects of some example embodiments of the present invention include a method of manufacturing a display device, the method being employed to improve the display quality of a display device by minimizing or reducing steps for forming driving elements.

Aspects of some example embodiments of the present invention may also include a display device having improved display quality by improving luminance uniformity of light emitted from an organic light emitting element.

However, aspects of example embodiments are not restricted to the one set forth herein. The above and other aspects of example embodiments will become more apparent to one of ordinary skill in the art by referencing the detailed description below.

According to some example embodiments of the present invention, there is provided a method of manufacturing a display device. The method of manufacturing a display device includes: forming a conductive layer on a base; forming an organic layer, which has a hole partially exposing the conductive layer, on the conductive layer; polishing an upper surface of the organic layer; and forming a light emitting element on the polished organic layer.

In an example embodiment, the forming of the organic layer may comprise: applying an organic layer forming composition onto the conductive layer; and forming the organic layer having the hole by partially curing and developing the organic layer forming composition, wherein in the forming of the organic layer having the hole, the upper surface of the organic layer may have an uneven surface caused by a step of the conductive layer.

In an example embodiment, the polishing of the upper surface of the organic layer may comprise: bringing the upper surface of the organic layer and the conductive layer exposed by the hole into contact with a polishing slurry; and polishing the upper surface of the organic layer by using the polishing slurry and a polishing pad.

In an example embodiment, a surface of the conductive layer exposed through the hole may contain titanium, and the polishing slurry may have a pH of about 6.0 or higher.

In an example embodiment, the surface of the conductive layer exposed through the hole may contain titanium, and the polishing slurry may comprise polishing particles and a polishing aid, wherein the polishing aid may comprise one or more of polyacrylamide, polyacrylic acid, polyaminoether, polyethyleneimine and polyester elastomer.

In an example embodiment, the content of the polishing aid may be about 0.008% by weight or more based on the total weight of the polishing slurry.

In an example embodiment, in the bringing of the organic layer and the conductive layer into contact with the polishing slurry, at least a portion of the polishing aid may be adsorbed on the upper surface of the organic layer and an inner wall of the hole of the organic layer.

In an example embodiment, the method may further comprise forming a semiconductor material layer on the base before the forming of the conductive layer, wherein the forming of the conductive layer on the base may comprise: forming a first conductive layer on the semiconductor material layer to at least partially overlap the semiconductor material layer; and forming a second conductive layer on the first conductive layer to be insulated from the first conductive layer.

In an example embodiment, the method may further comprise forming an insulating layer, which insulates the first conductive layer and the second conductive layer, between the forming of the first conductive layer and the forming of the second conductive layer, wherein the insulating layer may have a hole which partially exposes the first conductive layer and is connected to the hole of the organic layer, and the polishing slurry may comprise polishing particles and a polishing aid, wherein the polishing aid may comprise one or more of polyacrylamide, polyacrylic acid, polyaminoether, polyethyleneimine and polyester elastomer.

In an example embodiment, in the bringing of the conductive layer into contact with the polishing slurry, the polishing slurry may contact the first conductive layer, and at least a portion of the polishing aid may be adsorbed on an inner wall of the hole of the insulating layer.

In an example embodiment, the forming of the conductive layer on the base may further comprise forming a third conductive layer on the second conductive layer, and wherein the method may further comprise forming an insulating layer, which insulates the second conductive layer and the third conductive layer, between the forming of the second conductive layer and the forming of the third conductive layer, wherein the insulating layer may have a hole which partially exposes the second conductive layer and is connected to the hole of the organic layer, and the polishing slurry may comprise polishing particles and a polishing aid, wherein the polishing aid may comprise one or more of polyacrylamide, polyacrylic acid, polyaminoether, polyethyleneimine and polyester elastomer.

In an example embodiment, in the bringing of the conductive layer into contact with the polishing slurry, the polishing slurry may contact the second conductive layer, and at least a portion of the polishing aid may be adsorbed on an inner wall of the hole of the insulating layer.

In an example embodiment, the second conductive layer may comprise: a first conductive pattern which contacts the semiconductor material layer; and a second conductive pattern which is spaced apart from the semiconductor material layer and at least partially overlaps the semiconductor material layer, wherein the first conductive pattern may be partially exposed through the hole of the organic layer, and the second conductive pattern may be completely covered by the organic layer without being exposed.

In an example embodiment, the forming of the light emitting element may comprise: forming an anode, which is electrically connected to the first conductive pattern via the hole of the organic layer, on the organic layer; forming an organic light emitting layer on the anode; and forming a cathode on the organic light emitting layer, wherein the first conductive pattern and the second conductive pattern at least partially may overlap the anode.

In an example embodiment, the method may further comprises forming an inorganic layer, which comprises an inorganic material, between the forming of the first conductive layer and the forming of the second conductive layer, wherein the second conductive layer may be directly placed on the inorganic layer and may be a groove partially exposing the inorganic layer.

In an example embodiment, the forming of the light emitting element may comprise, forming an anode, which is electrically connected to the second conductive layer via the hole of the organic layer, on the organic layer, forming an organic light emitting layer on the anode, and forming a cathode on the organic light emitting layer, wherein the groove may overlap the anode.

In an example embodiment, the display device may comprise a display area which displays an image and a non-display area which is located around the display area and does not display an image, wherein the organic layer may be formed over the display area and the non-display area, and the hole exposing the conductive layer may comprise a first hole located in the display area and a second hole located in the non-display area.

In an example embodiment, an upper surface of the conductive layer exposed by the first hole and an upper surface of the conductive layer exposed by the second hole may be located at different levels.

According to an example embodiment of the invention, there is provided a display device. The display device comprises: a base; a first conductive layer which is on the base; an organic layer which is on the first conductive layer and has a hole partially exposing the first conductive layer; a light emitting element which is on the organic layer; and a polymer material which is partially adsorbed on a surface of the organic layer, wherein the polymer material comprises one or more of polyacrylamide, polyacrylic acid, polyaminoether, polyethyleneimine and polyester elastomer.

In an example embodiment, the polymer material may be adsorbed on a surface of an inner wall of the hole of the organic layer.

In an example embodiment, the display device may further comprise an insulating layer which is interposed between the first conductive layer and the organic layer and made of an inorganic material, wherein the insulating layer may have a hole which partially exposes the first conductive layer and is connected to the hole of the organic layer, and the polymer material may be further adsorbed on a surface of an inner wall of the hole of the insulating layer.

In an example embodiment, the display device may further comprise: a semiconductor material layer which is between the base and the first conductive layer; and a second conductive layer which is between the insulating layer and the organic layer, wherein the second conductive layer may be electrically connected to the light emitting element and the semiconductor material layer.

In an example embodiment, the light emitting element may comprise: an anode which is directly on the organic layer and is inserted into the hole of the organic layer to be electrically connected to the first conductive layer; a cathode which is on the anode; and an organic light emitting layer which is interposed between the anode and the cathode, wherein the anode inserted into the hole may contact the surface of the organic layer on which the polymer material is adsorbed.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
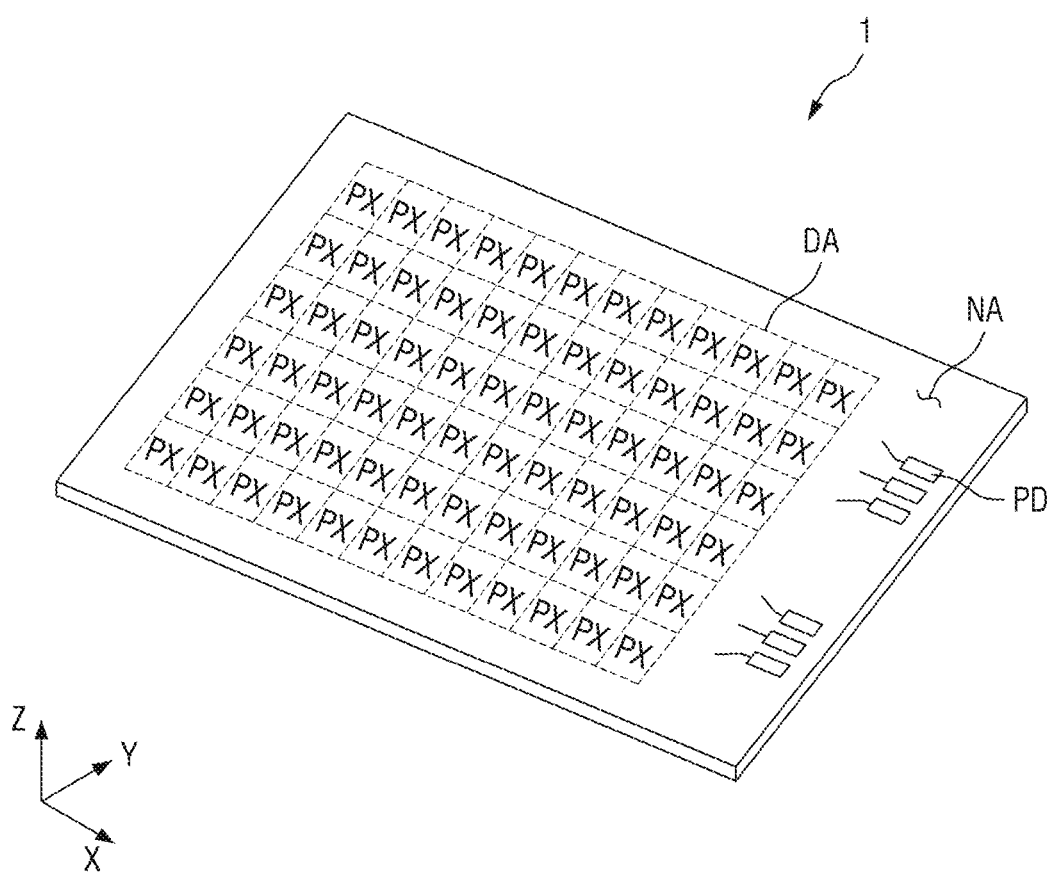
FIG. 1 is a perspective view of a display device according to some example embodiments.

Aspects of some example embodiments of the present invention and methods of accomplishing the same may be understood more readily by reference to the following detailed description of example embodiments and the accompanying drawings. The invention may, however, be embodied in many different forms and should not be construed as being limited to the embodiments set forth herein. Rather, these example embodiments are provided so that this disclosure will be thorough and complete and will fully convey the concept of the invention to those skilled in the art, and the invention will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

In the present specification, a first direction X is any direction in a plane, a second direction Y is a direction intersecting the first direction X in the plane, and a third direction Z is a direction perpendicular to the plane.

Hereinafter, embodiments will be described with reference to the accompanying drawings.

FIG. 1 is a perspective view of a display device 1 according to some example embodiments. Referring to FIG. 1, the display device 1 according to some example embodiments may include a display area DA and a non-display area NA. The display area DA is an area contributing to substantial image display by including a plurality of pixels PX. As used herein, 'pixels' refer to single regions into which the display area DA is divided for color display in a plan view, and one pixel is a single region defined as a minimum unit that can express a color independently of other pixels. That is, each of the pixels PX may uniquely display one of predetermined primary colors to implement color display. Examples of the primary colors include red, green and blue. The pixels PX may be arranged along a first direction X and a second direction Y substantially in a matrix in a plane. As used herein, 'plane' refers to a plane to which the first direction X and the second direction Y belong.

In a plan view, the display area DA may be surrounded by the non-display area NA. In the non-display area NA, elements necessary for driving the display device 1 may be located. In an embodiment, a plurality of pad portions PD may be located in the non-display area NA. The pad portions PD may be electrically connected to an external driving circuit element such as a printed circuit board (not illustrated) or a chip-on film package. The pad portions PD and the driving circuit element may be electrically connected by, but not limited to, an anisotropic conductive film, an anisotropic conductive adhesive, or an anisotropic conductive paste. In some embodiments, a portion of the non-display area NA, for example, at least a portion of the non-display area NA which includes the pad portions PD may be bent.

Figure 2:
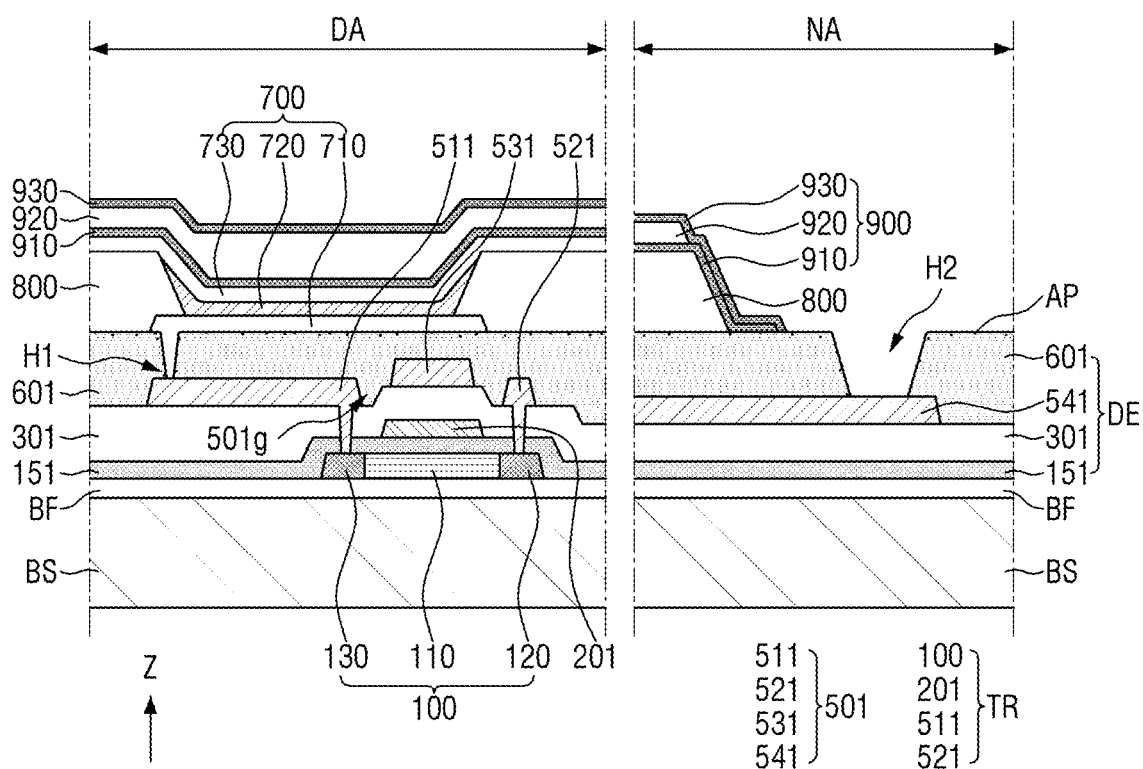
FIG. 2 is a cross-sectional view of a display area and a non-display area of the display device of FIG. 1.

The display device 1 according to the current embodiment will now be described in more detail by additionally referring to FIG. 2. FIG. 2 is a cross-sectional view of the display area DA and the non-display area NA of the display device 1 of FIG. 1, specifically, a cross-section view of a pixel PX in the display area DA and a pad portion PD in the non-display area NA.

Referring to FIGS. 1 and 2, the display device 1 according to the current embodiment may be an organic light emitting display including a light emitting element 700 (e.g., an organic light emitting element) arranged in each pixel. The display device 1 will hereinafter be described as, for example, an organic light emitting display. However, the display device 1 may also be a liquid crystal display, an electrophoretic display, or the like.

In an embodiment, the display device 1 may include a base BS, a driving element layer DE, and the light emitting element 700.

The base BS may be a transparent or opaque insulating substrate. In some embodiments, the base BS may be a flexible insulating film. For example, the base BS may be made of a glass material, a quartz material, or a flexible polymer material such as polyimide, polycarbonate, polyethylene terephthalate or polyacrylate.

A buffer layer BF may be arranged on a surface (an upper surface in FIG. 2) of the base BS. The buffer layer BF may protect the base BS and prevent impurities such as moisture or air from penetrating into the base BS. In addition, the buffer layer BF may prevent the base BS from being damaged in the process of forming a semiconductor material layer 100 which will be described later. The buffer layer BF may be made of an inorganic material such as silicon nitride (SiNx), silicon oxide (SiOx), silicon nitride oxide (SiNxOy), or silicon oxynitride (SiOxNy). In some example embodiments, the buffer layer BF may be arranged over the display area DA and the non-display area NA. In this specification, when an element is arranged over a plurality of areas, it means that the element extends over the space provided by the areas. In some embodiments, the buffer layer BF may be omitted.

The driving element layer DE may be arranged on the buffer layer BF. The driving element layer DE may include driving elements which include a semiconductor material layer 100, a first conductive layer 201 and a second conductive layer 501 and a plurality of insulating layers 151 and 301 which insulate the driving elements from each other.

The semiconductor material layer 100 may be arranged on the buffer layer BF. The semiconductor material layer 100 may include a material having a semiconducting nature. For example, the semiconductor material layer 100 may include polycrystalline silicon. In an embodiment, the semiconductor material layer 100 may include monocrystalline silicon, amorphous silicon, or other semiconducting materials such as oxide semiconductors other than silicon series.

The semiconductor material layer 100 may include a patterned semiconductor pattern. The semiconductor pattern of the semiconductor material layer 100 may provide a channel through which current and/or electrons can move in a thin-film transistor TR. For example, the semiconductor material layer 100 may include a channel region 110 and a drain region 120 and a source region 130 arranged on both sides of the channel region 110. The channel region 110 may be a region where a passage (channel) through which electrons or holes can move is formed. That is, electrons or holes provided through the drain region 120 may move toward the source region 130 through the channel region 110, or electrons or holes provided through the source region 130 may move toward the drain region 120 through the channel region 110.

The drain region 120 and the source region 130 may be spaced apart from each other with the channel region 110 interposed between them. Each of the drain region 120 and the source region 130 may have a greater electrical conductivity than the channel region 110. For example, each of the drain region 120 and the source region 130 may become conductive by plasma treatment or ion doping. The drain region 120 may be electrically connected to a drain pattern 521 to which an input signal is transmitted, and the source region 130 may be electrically connected to a source pattern 511 which will be described later. As used herein, 'electrically connected' denotes not only a case where two conductive elements are in direct contact with each other to conduct electricity but also a case where a conductive element is interposed between two elements to conduct electricity or a case where a switching element such as one or more thin-film transistors is interposed between two elements to conduct electricity whenever necessary.

In FIG. 2, one thin-film transistor TR is illustrated to explain a case where the semiconductor material layer 100 includes one semiconductor pattern. However, when the display device 1 includes a plurality of thin-film transistors, the semiconductor material layer 100 may include a plurality of semiconductor patterns.

The first conductive layer 201 may be arranged on the semiconductor material layer 100. The first conductive layer 201 may include a gate pattern and a scan signal line. The first conductive layer 201 may at least partially overlap the semiconductor material layer 100 in a third direction Z. As used herein, 'overlap' denotes overlapping in the third direction Z, unless otherwise defined.

The first conductive layer 201 may include a conductive material such as aluminum (Al), molybdenum (Mo), copper (Cu), titanium (Ti), or an alloy of these materials. The first conductive layer 201 may be a single layer or may have a laminated structure of different conductive materials.

The gate pattern of the first conductive layer 201 may at least partially overlap the semiconductor pattern of the semiconductor material layer 100. The gate pattern of the first conductive layer 201 may form a control terminal of the thin-film transistor TR. The gate pattern may be electrically connected to an output electrode of a switching transistor that controls ON/OFF of a specific pixel. For example, the gate pattern may be electrically connected to the output electrode of the switching transistor by being in contact with the output electrode of the switching transistor or may be electrically connected to the output electrode of the switching transistor by one or more thin-film transistors.

A gate insulating layer 151 may be interposed between the semiconductor material layer 100 and the first conductive layer 201 to insulate the semiconductor material layer 100 from the first conductive layer 201. The gate insulating layer 151 may include an insulating inorganic material such as silicon nitride, silicon oxide, silicon nitride oxide, or silicon oxynitride. In some embodiments, the gate insulating layer 151 may be arranged over the display area DA and the non-display area NA. The gate insulating layer 151 in the display area DA may have through holes that partially expose the semiconductor material layer 100, for example, the drain region 120 and the source region 130 of the semiconductor material layer 100.

The second conductive layer 501 may be arranged on the first conductive layer 201. The second conductive layer 501 includes the drain pattern 521, the source pattern 511, a capacitor electrode pattern 531 and a pad electrode pattern 541 and may further include a data signal line (not illustrated) or a driving voltage line (not illustrated).

The second conductive layer 501 may include a conductive material such as aluminum, molybdenum, copper, titanium, or an alloy of these materials. The second conductive layer 501 may be a single layer or may have a laminated structure of different conductive materials. In some embodiments in which the second conductive layer 501 is a single layer, the second conductive layer 501 may include titanium or a titanium alloy. In some embodiments in which the second conductive layer 501 has a laminated structure, a top layer of the second conductive layer 501 may include titanium or a titanium alloy.

The drain pattern 521 of the second conductive layer 501 may at least partially overlap the semiconductor pattern of the semiconductor material layer 100. The drain pattern 521 of the second conductive layer 501 may be electrically connected to the semiconductor material layer 100 via a through hole formed in the gate insulating layer 151 and an interlayer insulating layer 301. For example, the drain pattern 521 may be inserted into the through hole to contact the drain region 120 of the semiconductor material layer 100. The drain pattern 521 of the second conductive layer 501 may be a conductive pattern and may form an input terminal of the thin-film transistor TR. The drain pattern 521 may be electrically connected to a driving voltage line (not illustrated). For example, the drain pattern 521 may be physically integrated with the driving voltage line (not illustrated), may be electrically connected to the driving voltage line (not illustrated) by being in contact with the driving voltage line, or may be electrically connected to the driving voltage line by one or more thin-film transistors.

The source pattern 511 of the second conductive layer 501 may at least partially overlap the semiconductor pattern of the semiconductor material layer 100. The source pattern 511 of the second conductive layer 501 may be electrically connected to the semiconductor material layer 100 via a through hole formed in the gate insulating layer 151 and the interlayer insulating layer 301. For example, the source pattern 511 may be inserted into the through hole to contact the source region 130 of the semiconductor material layer 100. The source pattern 511 of the second conductive layer 501 may be a conductive pattern and may form an output terminal of the thin-film transistor TR. The source pattern 511 may be electrically connected to the light emitting element 700.

The capacitor electrode pattern 531 of the second conductive layer 501 may at least partially overlap the first conductive layer 201 in the third direction Z. For example, the capacitor electrode pattern 531 of the second conductive layer 501 may at least partially overlap the gate pattern of the first conductive layer 201. The capacitor electrode pattern 531 may be a conductive pattern and may form a storage capacitor together with the gate pattern. That is, the capacitor electrode pattern 531 and the gate pattern may form an electrode and the other electrode of the storage capacitor, respectively. The same voltage as the voltage applied to the drain pattern 521 may be applied to the capacitor electrode pattern 531. Alternatively, the capacitor electrode pattern 531 may be in a floating state. Alternatively, a voltage (e.g., a predetermined voltage) may be applied to the capacitor electrode pattern 531.

The pad electrode pattern 541 of the second conductive layer 501 may form a pad portion PD of FIG. 1. That is, the pad electrode pattern 541 may provide a space for electrically connection to an external driving circuit element such as a printed circuit board or a chip-on-film package.

The pad electrode pattern 541 of the second conductive layer 501 may be at least partially located in the non-display area NA. For example, the pad electrode pattern 541 may be located only in the non-display area NA and electrically connected to a predetermined conductive layer in the display area DA or may extend from the display area DA to the non-display area NA.

In an embodiment, the second conductive layer 501 may have a groove 501g. The groove 501g may be formed between the source pattern 511 and the capacitor electrode pattern 531 of the second conductive layer 501 and/or between the capacitor electrode pattern 531 and the drain pattern 521. The groove 501g of the second conductive layer 501 may partially expose the surface of the interlayer insulating layer 301. The groove 501g may be overlapped by an anode 710 of the light emitting element 700 which will be described later.

The interlayer insulating layer 301 may be interposed between the first conductive layer 201 and the second conductive layer 501 to insulate the first conductive layer 201 and the second conductive layer 501 from each other. In FIG. 2, the interlayer insulating layer 301 is a single layer. However, in an embodiment, the interlayer insulating layer 301 may have a laminated structure of a plurality of layers. The interlayer insulating layer 301 may be an inorganic layer including an insulating inorganic material such as silicon nitride, silicon oxide, silicon nitride oxide, or silicon oxynitride. In some embodiments, the interlayer insulating layer 301 may be arranged over the display area DA and the non-display area NA. The interlayer insulating layer 301 in the display area DA may have through holes which partially expose the semiconductor material layer 100, for example, the drain region 120 and the source region 130 of the semiconductor material layer 100.

The semiconductor pattern of the semiconductor material layer 100, the gate pattern of the first conductive layer 201, and the drain pattern 521 and the source pattern 511 of the second conductive layer 501 may constitute the thin-film transistor TR which is a three-terminal element. The thin-film transistor TR may be a driving transistor that controls the driving of the light emitting element 700 to adjust the amount of light emitted by the light emitting element 700 of a specific pixel. For example, the thin-film transistor TR may be configured to control the amount of current flowing from the input terminal (i.e., the drain pattern 521) to the output terminal (i.e., the source pattern 511) via the channel (i.e., the semiconductor pattern) in response to a signal transmitted to the control terminal (i.e., the gate pattern).

Although not illustrated in the drawings, in some embodiments, the driving element layer DE may further include driving elements necessary for driving the display device 1, such as one or more additional thin-film transistors, wirings and/or auxiliary electrodes.

An organic layer 601 may be arranged on the driving element layer DE. The organic layer 601 may protect the semiconductor material layer 100, the first conductive layer 201, the second conductive layer 501, the thin-film transistor TR and other elements necessary for driving the display device 1, which are arranged on the surface (the upper surface in FIG. 2) of the base BS, and compensate for a step formed by the semiconductor material layer 100, the first conductive layer 201, the second conductive layer 501 or the thin-film transistor TR. That is, the organic layer 601 may be a step difference compensating layer or a planarizing layer. The organic layer 601 may provide a space in which the light emitting element 700 can be stably arranged. An upper surface of the organic layer 601 may have excellent flatness. This may make it easy to control the position, shape and thickness of the light emitting element 700 and improve the characteristics of light emitted from the light emitting element 700.

The organic layer 601 may include an organic material such as epoxy resin, imide resin, or cardo resin. In FIG. 2, the organic layer 601 is a single layer. However, in an embodiment, the organic layer 601 may have a laminated structure of a plurality of layers. The organic layer 601 may be arranged over the display area DA and the non-display area NA.

The organic layer 601 may have a plurality of holes H1 and H2 that at least partially expose the second conductive layer 501. For example, the organic layer 601 may have a first hole H1 located in the display area DA and a second hole H2 located in the non-display area NA. Each of the first hole H1 and the second hole H2 may pass through the organic layer 601. The first hole H1 may partially expose the source pattern 511 of the second conductive layer 501, and the second hole H2 may partially expose an upper surface of the pad electrode pattern 541 of the second conductive layer 501. The surface of the second conductive layer 501 exposed by the second hole H2 may contain titanium or a titanium alloy. The first hole H1 and the second hole H2 may be shaped like substantially circular or quadrilateral dots in plan view. The anode 710 of the light emitting element 700 to be described later may be inserted into the first hole H1 to be electrically connected to the source pattern 511. In addition, the pad electrode pattern 541 exposed by the second hole H2 may form a pad portion PD by itself or may form a pad portion PD through a connection electrode inserted into the second hole H2.

In some embodiments, the source pattern 511 of the second conductive layer 501 which is exposed by the first hole H1 and the pad electrode pattern 541 of the second conductive layer 501 which is exposed by the second hole H2 may be located at different levels. An upper surface of the source pattern 511 exposed by the first hole H1 may be located at a higher level from the upper surface (in FIG. 2) of the base BS than an upper surface of the pad electrode pattern 541 exposed by the second hole H2. In addition, a depth of the second hole H2 located in the non-display area NA may be greater than that of the first hole H1 located in the display area DA. The depth of each of the first hole H1 and the second hole H2 refers to a vertical length from the uppermost surface of the organic layer 601 to the surface of the second conductive layer 501 exposed by the first hole H1 or the second hole H2.

In an embodiment, the organic layer 601 may include a polymer material AP partially adsorbed on its surface. That is, the content of the polymer material AP may be partially different on the surface of the organic layer 601 and in the organic layer 601. The polymer material AP may be made of a material different from the organic material that forms the organic layer 601. The polymer material AP may include one or more of polyacrylamide, polyacrylic acid, polyaminoether, polyethyleneimine, and polyester elastomer. The polymer material AP may be adsorbed on the surface of the organic layer 601 during the planarization of the organic layer 601, but embodiments are not limited to this case.

For example, the polymer material AP may be adsorbed on the surface of an inner wall of each of the first hole H1 and the second hole H2 of the organic layer 601. That is, the content of the polymer material AP in the organic layer 601 may be partially different along a horizontal direction (e.g., the first direction X or the second direction Y), and the polymer material AP may form a continuous concentration gradient in the first direction X and/or the second direction Y.

In addition, the polymer material AP may be adsorbed on the surface of the organic layer 601 which is in contact with the anode 710 and the surface of the organic layer 601 which is in contact with a pixel defining layer 800. That is, the content of the polymer material AP in the organic layer 601 may be partially different along the third direction Z, and the polymer material AP may form a continuous concentration gradient in the third direction Z.

In some embodiments in which the second conductive layer 501 exposed by the first hole H1 and the second hole H2 is made of a metal material, the polymer material AP may not be adsorbed on the surface of the second conductive layer 501.

The light emitting element 700 may be arranged on the organic layer 601. The light emitting element 700 may be an organic light emitting element which includes the anode 710 and a cathode 730 opposite to each other and an organic light emitting layer 720 interposed between the anode 710 and the cathode 730.

The anode 710 may be arranged on the organic layer 601. For example, the anode 710 may be arranged directly on the organic layer 601 to be in direct contact with the upper surface of the organic layer 601 on which the polymer material AP is adsorbed. The anode 710 may be electrically connected to the source pattern 511 via the first hole H1 of the organic layer 601. In this case, the anode 710 inserted into the first hole H1 may contact the inner wall of the first hole H1 of the organic layer 601 on which the polymer material AP is adsorbed.

The anode 710 may have a relatively larger work function than the cathode 730. The anode 710 may be a transparent electrode, an opaque electrode, or a laminated structure of a transparent electrode and an opaque electrode. Examples of the material that forms the transparent electrode include indium tin oxide (ITO), indium zinc oxide (IZO), zinc oxide, and indium oxide. Examples of the material that forms the opaque electrode include lithium (Li), aluminum (Al), magnesium (Mg), silver (Ag), nickel (Ni), and chromium (Cr). The anode 710 may be a pixel electrode which is arranged in each pixel PX of the display area DA and to which an independent driving signal is transmitted.

In some embodiments, the source pattern 511 and the capacitor electrode pattern 531 described above may at least partially overlap the anode 710 in the third direction Z. That is, at least a portion of the groove 501*g* of the second conductive layer 501 may overlap the anode 710. Because the planar positions of elements of the driving element layer DE substantially overlap the position of the anode 710, for example, the position of a light emitting region of the light emitting element 700, the display device 1 having excellent display quality (e.g., luminance) and high resolution can be provided without a reduction in emission area. In addition, since the upper surface of the organic layer 601 has excellent flatness as described above, the deterioration of the display quality of the display device 1 can be prevented (or reduced) even though the elements of the driving element layer DE overlap the light emitting element 700.

The cathode 730 may be arranged on the anode 710. The cathode 730 and the anode 710 may be spaced apart from each other with the organic light emitting layer 720 interposed between them. The cathode 730 may have a relatively smaller work function than the anode 710. Like the anode 710, the cathode 730 may be a transparent electrode, an opaque electrode, or a laminated structure of a transparent electrode and an opaque electrode. The cathode 730 may be arranged over the pixels PX without distinction between the pixels PX.

The organic light emitting layer 720 may be interposed between the anode 710 and the cathode 730. The organic light emitting layer 720 may emit light by recombining holes and electrons received from the anode 710 and the cathode 730.

The organic light emitting layer 720 may emit light having a predetermined color. For example, the organic light emitting layer 720 may emit red phosphorescent or fluorescent light having a peak wavelength in the range of about 610 nm to about 650 nm, may emit green phosphorescent or fluorescent light having a peak wavelength in the range of about 510 nm to about 570 nm, or may emit blue phosphorescent or fluorescent light having a peak wavelength in the range of about 430 nm to about 470 nm. In some embodiments, the organic light emitting layer 720 may have a laminated structure including one or more of an organic light emitting layer for emitting red light, an organic light emitting layer for emitting green light and an organic light emitting layer for emitting blue light and may emit white light.

In FIG. 2, the organic light emitting layer 720 is arranged in one pixel PX. However, in some example embodiments, the organic light emitting layer 720 may be arranged over a plurality of pixels PX. Although not illustrated in the drawings, one or more of a hole control region, an electron control region, a hole blocking region, and an electron blocking region may further be interposed between the anode 710 and the organic light emitting layer 720 or between the cathode 730 and the organic light emitting layer 720 to improve the luminous efficiency of the light emitting element 700.

In some embodiments, the pixel defining layer 800 may be arranged on the anode 710. The pixel defining layer 800 may define each pixel PX in the display area DA. The pixel defining layer 800 may include an organic material such as acrylic resin, epoxy resin, imide resin, ester resin, or cardo resin. The pixel defining layer 800 and the organic layer 601 may be made of the same or different materials.

The pixel defining layer 800 may have an opening that partially exposes the surface of the anode 710. That is, in a plan view, the pixel defining layer 800 may have an opening that exposes the anode 710 arranged in each pixel PX. In addition, the pixel defining layer 800 may be partially arranged in the non-display area NA, but embodiments are not limited to this case.

The pixel defining layer 800 may contact the anode 710 and the upper surface of the organic layer 601 on which the polymer material AP is adsorbed. The organic light emitting layer 720 and the cathode 730 described above may be arranged on the pixel defining layer 800 to be in contact with the pixel defining layer 800, but embodiments are not limited to this case.

The organic layer 601 of the display device 1 according to the current embodiment may have excellent flatness, and the upper surface of the organic layer 601 may be substantially completely flat. This can facilitate the formation of the light emitting element 700 and the pixel defining layer 800 and improve the display quality of the display device 1.

An encapsulation member 900 may be arranged on the light emitting element 700. The encapsulation member 900 may completely encapsulate the light emitting element 700. The encapsulation member 900 may prevent impurities such as moisture or air from penetrating from the outside of the display device 1 to damage or denature the light emitting element 700, for example, the organic light emitting layer 720 of the light emitting element 700.

The encapsulation member 900 may be a thin-film encapsulating film including a plurality of layers. The encapsulation member 900 may include one or more inorganic layers and one or more organic layers. For example, the encapsulation member 900 may include an inorganic layer and an organic layer alternately arranged. In an embodiment, the encapsulation member 900 may include a first inorganic encapsulation layer 910 arranged on the cathode 730, an organic encapsulation layer 920 arranged on the first inorganic encapsulation layer 910, and a second inorganic encapsulation layer 930 arranged on the organic encapsulation layer 920. The first inorganic encapsulation layer 910, the organic encapsulation layer 920 and the second inorganic encapsulation layer 930 may be arranged over the display area DA and the non-display area NA.

The first inorganic encapsulation layer 910 may be in contact with the cathode 730. In addition, at least a portion of the first inorganic encapsulation layer 910 may be arranged in the non-display area NA, and the first inorganic encapsulation layer 910 may be in contact with the pixel defining layer 800 and the upper surface of the organic layer 910 on which the polymer material AP is adsorbed.

The second inorganic encapsulation layer 930 may form a top layer of the encapsulation member 900. The planar area of the second inorganic encapsulation layer 930 may be larger than the planar area of the first inorganic encapsulation layer 910. For example, at least a portion of the second inorganic encapsulation layer 930 may be arranged in the non-display area NA, and the second inorganic encapsulation layer 930 may contact the organic encapsulation layer 920 and the first inorganic encapsulation layer 910 and may further contact a side surface of the first inorganic encapsulation layer 910 and the upper surface of the organic layer 601 on which the polymer material AP is adsorbed.

The organic encapsulation layer 920 may be interposed between the first inorganic encapsulation layer 910 and the second inorganic encapsulation layer 930 and may be in contact with the first inorganic encapsulation layer 910 and the second inorganic encapsulation layer 930. In some embodiments, the encapsulation member 900 may include a siloxane-based encapsulation layer such as hexamethyldisiloxane.

In FIG. 2, the encapsulation member 900 has a three-layer laminated structure. However, embodiments are not limited to this case. The encapsulation member 900 can have a two-layer laminated structure or a laminated structure of four or more layers. In an embodiment, the encapsulation member 900 may include an encapsulation substrate made of a glass material or a quartz material or an encapsulation substrate made of a metal material.

Although not illustrated in the drawings, in some embodiments, a touch unit and/or a window glass may be further arranged on the encapsulation member 900. The touch unit may sense a touch signal generated by a user's touch operation. The touch signal may include the position of a touch operation or the magnitude of a touch pressure. The window glass may protect the display device 1, form a display surface of the display device 1 on which an image is displayed, and form the exterior of the display device 1. In addition, the window glass may form a touch surface on which a user performs a touch operation, that is, a surface which is physically touched by the user.

Hereinafter, additional aspects of display devices according to some example embodiments will be described. For simplicity, a description of elements substantially identical to those of the display device 1 according to the above-described embodiment will be omitted, and the substantially identical elements will be clearly understood by those skilled in the art from the accompanying drawings.

Figure 3:
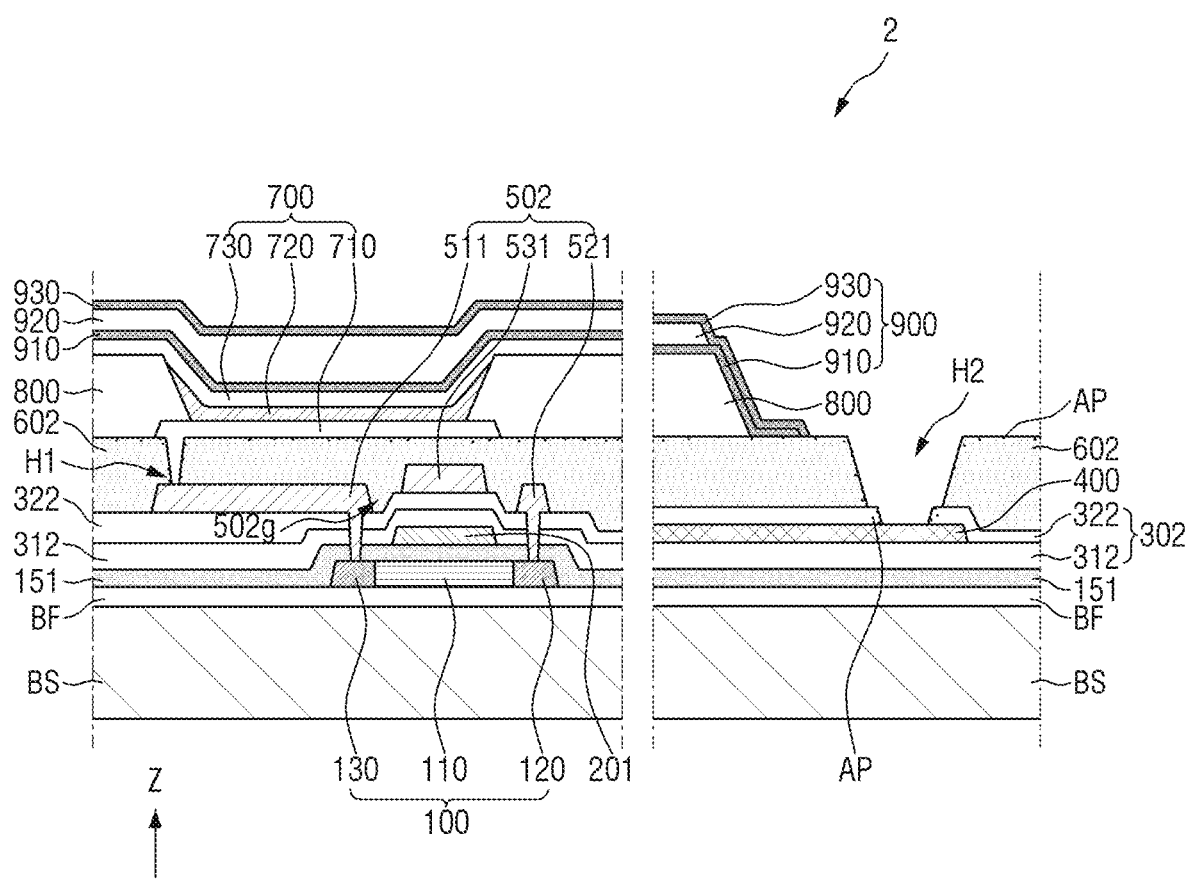
FIG. 3 is a cross-sectional view of a display device according to some example embodiments.

FIG. 3 is a cross-sectional view of a display device 2 according to an embodiment.

Referring to FIG. 3, the display device 2 according to the current embodiment is different from the display device 1 according to the embodiment of FIG. 2, etc. in that an interlayer insulating layer 302 includes a first interlayer insulating layer 312 and a second interlayer insulating layer 322, and a third conductive layer 400 arranged between the first interlayer insulating layer 312 and the second interlayer insulating layer 322 is further provided.

In an embodiment, a driving element layer of the display device 2 may include a first conductive layer 201 and a second conductive layer 502 and may further include the third conductive layer 400.

The first conductive layer 201 may be arranged on a semiconductor material layer 100. The first conductive layer 201 may include a gate pattern and a scan signal line. In addition, the second conductive layer 502 may be arranged on the first conductive layer 201. The second conductive layer 502 may include a drain pattern 521, a source pattern 511 and a capacitor electrode pattern 531 and may further include a data signal line or a driving voltage line. The second conductive layer 502 may have a groove 502g that partially exposes the surface of the interlayer insulating layer 302. The gate pattern of the first conductive layer 201 and the drain pattern 521 and the source pattern 511 of the second conductive layer 502 may constitute a thin-film transistor which is a three-terminal element. Because the first conductive layer 201 and the second conductive layer 502 have been described above, a redundant description thereof is omitted.

The third conductive layer 400 may be arranged between the first conductive layer 201 and the second conductive layer 502. The third conductive layer 400 may include a pad electrode pattern located at least partially in a non-display area NA. The pad electrode pattern of the third conductive layer 400 located in the non-display area NA may form a pad portion (e.g., a pad portion PD of FIG. 1) of the display device 2. In FIG. 3, the third conductive layer 400 is located only in the non-display area NA. However, embodiments are not limited to this case. In an embodiment, the third conductive layer 400 may also be arranged in a display area DA to form wirings or auxiliary electrodes necessary for driving the display device 2 and may extend from the display area DA to the non-display area NA. In some example embodiments, a portion of the third conductive layer 400 may form a terminal of another thin-film transistor.

The third conductive layer 400 may include a conductive material such as aluminum, molybdenum, copper, titanium, or an alloy of these materials. The third conductive layer 400 may be a single layer or may have a laminated structure of different conductive materials. In some embodiments in which the third conductive layer 400 is a single layer, the third conductive layer 400 may include titanium or a titanium alloy. In some embodiments in which the third conductive layer 400 has a laminated structure, a top layer of the third conductive layer 400 may include titanium or a titanium alloy.

The interlayer insulating layer 302 may have a laminated structure of the first interlayer insulating layer 312 and the second interlayer insulating layer 322. For example, the first interlayer insulating layer 312 may be interposed between the first conductive layer 201 and the third conductive layer 400 to insulate the first conductive layer 201 and the third conductive layer 400 from each other, and the second interlayer insulating layer 322 may be interposed between the third conductive layer 400 and the second conductive layer 502 to insulate the third conductive layer 400 and the second conductive layer 502 from each other.

Each of the first interlayer insulating layer 312 and the second interlayer insulating layer 322 may be an inorganic layer including an insulating inorganic material such as silicon nitride, silicon oxide, silicon nitride oxide, or silicon oxynitride. The first interlayer insulating layer 312 and the second interlayer insulating layer 322 may be made of the same material or different materials. Through holes that partially expose a drain region 120 and a source region 130 of the semiconductor material layer 100 may be formed over the first interlayer insulating layer 312 and the second interlayer insulating layer 322.

An organic layer 602 may be arranged on the second conductive layer 502. The organic layer 602 may be arranged over the display area DA and the non-display area NA.

In an embodiment, the organic layer 602 and the second interlayer insulating layer 322 may have a plurality of holes H1 and H2 that at least partially expose the second conductive layer 502 and the third conductive layer 400. For example, a first hole H1 located in the display area DA may partially expose the source pattern 511 of the second conductive layer 502, and a second hole H1 located in the non-display area NA may partially expose an upper surface of the third conductive layer 400. An anode 710 of a light emitting element 700 may be inserted into the first hole H1 to be electrically connected to the source pattern 511, and the third conductive layer 400 exposed by the second hole H2 may form a pad portion by itself or may form a pad portion through a connection electrode inserted into the second hole H2. The surface of the third conductive layer 400 exposed by the second hole H2 may contain titanium or a titanium alloy.

The first hole H1 may pass through the organic layer 602. In addition, the second hole H2 may pass through the organic layer 602 and the second interlayer insulating layer 322. For example, a hole formed in the organic layer 602 and a hole formed in the second interlayer insulating layer 322 may be connected to each other to form the second hole H2. The planar area of the hole formed in the organic layer 602 may be larger than the planar area of the hole formed in the second interlayer insulating layer 322, and at least a portion of the second interlayer insulating layer 322 may be exposed without being covered by the organic layer 602.

In some embodiments, the source pattern 511 of the second conductive layer 502 exposed by the first hole H1 and the third conductive layer 400 exposed by the second hole H2 may be located at different levels. For example, an upper surface of the source pattern 511 exposed by the first hole H1 may be located at a higher level than the upper surface of the third conductive layer 400 exposed by the second hole H2. In addition, a depth of the second hole H2 located in the non-display area NA may be greater than that of the first hole H1 located in the display area DA. The depths of the first hole H1 and the second hole H2 refer to vertical lengths from the uppermost surface of the organic layer 602 to the surfaces of the second conductive layer 502 and the third conductive layer 400 exposed by the first hole H1 and the second hole H2, respectively.

In an embodiment, the organic layer 602 and the second interlayer insulating layer 322 may include a polymer material AP partially adsorbed on their surfaces. The polymer material AP may include one or more of polyacrylamide, polyacrylic acid, polyaminoether, polyethyleneimine and polyester elastomer. The polymer material AP may be adsorbed on the surfaces of the organic layer 602 and the second interlayer insulating layer 322 during the planarization of the organic layer 602, but embodiments are not limited to this case.

For example, the polymer material AP may be adsorbed on an inner wall of the first hole H1 of the organic layer 602 and on an inner wall of the hole of the organic layer 602 which forms the second hole H2. In addition, the polymer material AP may be adsorbed on an inner wall of the hole of the second interlayer insulating layer 322 which forms the second hole H2. When at least a portion of the second interlayer insulating layer 322 is exposed without being covered by the organic layer 602, the polymer material AP may also be partially adsorbed on an upper surface of the second interlayer insulating layer 322. In addition, the polymer material AP may be adsorbed on the surface of the organic layer 602 which is in contact with the anode 710 and the surface of the organic layer 602 which is in contact with a pixel defining layer 800.

Figure 4:
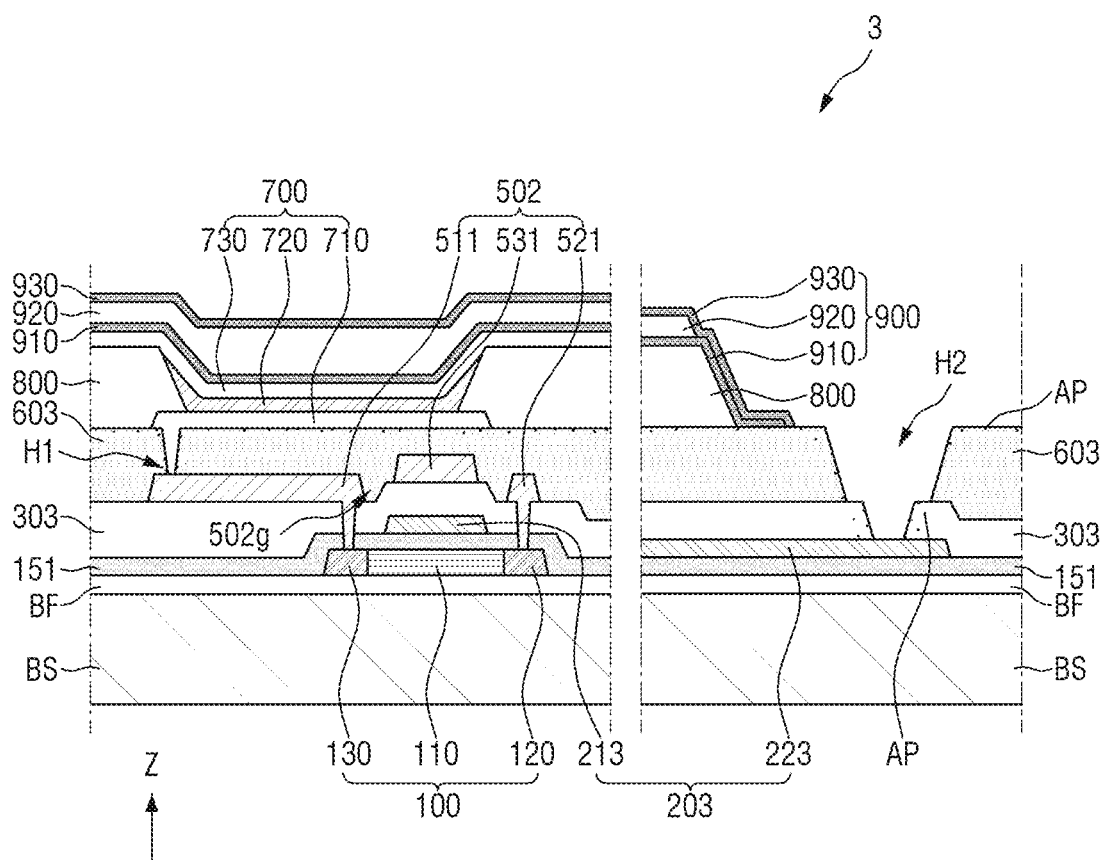
FIG. 4 is a cross-sectional view of a display device according to some example embodiments.

FIG. 4 is a cross-sectional view of a display device 3 according to an embodiment.

Referring to FIG. 4, the display device 3 according to the current embodiment is different from the display device 1 according to the embodiment of FIG. 2, etc. in that a first conductive layer 203 includes a gate pattern 213 and a pad electrode pattern 223, and the pad electrode pattern 223 is partially exposed through a second hole H2.

The first conductive layer 203 may be arranged on a semiconductor material layer 100. The first conductive layer 203 may be a single layer or may have a laminated structure of different conductive materials. In some embodiments in which the first conductive layer 203 is a single layer, the first conductive layer 203 may include titanium or a titanium alloy. In some embodiments in which the first conductive layer 203 has a laminated structure, a top layer of the first conductive layer 203 may include titanium or a titanium alloy. The first conductive layer 203 may include the gate pattern 213 and a scan signal line and may further include the pad electrode pattern 223. The gate pattern 213 of the first conductive layer 203 may at least partially overlap the semiconductor material layer 100 in the third direction Z.

The pad electrode pattern 223 of the first conductive layer 203 may form a pad portion (e.g., a pad portion PD of FIG. 1) of the display device 3. The pad electrode pattern 223 of the first conductive layer 203 may be at least partially located in a non-display area NA. For example, the pad electrode pattern 223 may be located only in the non-display area NA and electrically connected to a predetermined conductive layer in a display area DA or may extend from the display area DA to the non-display area NA.

In addition, a second conductive layer 502 may include a drain pattern 521, a source pattern 511 and a capacitor electrode pattern 531 and may further include a data signal line or a driving voltage line. The second conductive layer 502 may have a groove 502g that partially exposes the surface of an interlayer insulating layer 303. The gate pattern 213 of the first conductive layer 203 and the drain pattern 521 and the source pattern 511 of the second conductive layer 502 may constitute a thin-film transistor which is a three-terminal element.

The interlayer insulating layer 303 may be interposed between the first conductive layer 203 and the second conductive layer 502 to insulate the first conductive layer 203 and the second conductive layer 502 from each other. The interlayer insulating layer 303 may be a single layer or may have a laminated structure. The interlayer insulating layer 303 may be an inorganic layer including an insulating inorganic material such as silicon nitride, silicon oxide, silicon nitride oxide, or silicon oxynitride. The interlayer insulating layer 303 may be arranged over the display area DA and the non-display area NA.

An organic layer 603 may be arranged on the second conductive layer 502. The organic layer 603 may be arranged over the display area DA and the non-display area NA.

In an embodiment, the organic layer 603 and the interlayer insulating layer 303 may have a plurality of holes H1 and H2 that at least partially expose the second conductive layer 502 and the first conductive layer 203. For example, a first hole H1 located in the display area DA may partially expose the source pattern 511 of the second conductive layer 502, and the second hole H1 located in the non-display area NA may partially expose an upper surface of the pad electrode pattern 223 of the first conductive layer 203. An anode 710 of a light emitting element 700 may be inserted into the first hole H1 to be electrically connected to the source pattern 511, and the first conductive layer 203 exposed by the second hole H2 may form a pad portion by itself or may form a pad portion through a connection electrode inserted into the second hole H2. The surface of the first conductive layer 203 exposed by the second hole H2 may include titanium or a titanium alloy.

The first hole H1 may pass through the organic layer 603. In addition, the second hole H2 may pass through the organic layer 603 and the interlayer insulating layer 303. For example, a hole formed in the organic layer 603 and a hole formed in the interlayer insulating layer 303 may be connected to each other to form the second hole H2. The planar area of the hole formed in the organic layer 603 may be larger than the planar area of the hole formed in the interlayer insulating layer 303, and at least a portion of the interlayer insulating layer 303 may be exposed without being covered by the organic layer 603.

In some embodiments, the source pattern 511 of the second conductive layer 502 exposed by the first hole H1 and the first conductive layer 203 exposed by the second hole H2 may be located at different levels. For example, an upper surface of the source pattern 511 exposed by the first hole H1 may be located at a higher level than an upper surface of the first conductive layer 203 exposed by the second hole H2. In addition, a depth of the second hole H2 located in the non-display area NA may be greater than that of the first hole H1 located in the display area DA. The depths of the first hole H1 and the second hole H2 refer to vertical lengths from the uppermost surface of the organic layer 603 to the surfaces of the second conductive layer 502 and the first conductive layer 203 exposed by the first hole H1 and the second hole H2, respectively.

In an embodiment, the organic layer 603 and the interlayer insulating layer 303 may include a polymer material AP partially adsorbed on their surfaces. The polymer material AP may include one or more of polyacrylamide, polyacrylic acid, polyaminoether, polyethyleneimine, and polyester elastomer. The polymer material AP may be adsorbed on the surfaces of the organic layer 603 and the interlayer insulating layer 303 during the planarization of the organic layer 603, but embodiments are not limited to this case.

For example, the polymer material AP may be adsorbed on an inner wall of the first hole H1 of the organic layer 603 and on an inner wall of the hole of the organic layer 603 which forms the second hole H2. In addition, the polymer material AP may be adsorbed on an inner wall of the hole of the interlayer insulating layer 303 which forms the second hole H2. When at least a portion of the interlayer insulating layer 303 is exposed without being covered by the organic layer 603, the polymer material AP may also be partially adsorbed on an upper surface of the interlayer insulating layer 303. In addition, the polymer material AP may be adsorbed on the surface of the organic layer 603 which is in contact with the anode 710 and the surface of the organic layer 603 which is in contact with a pixel defining layer 800.

Hereinafter, methods of manufacturing a display device according to embodiments will be described.

FIGS. 5 through 12 are cross-sectional views illustrating a method of manufacturing a display device according to an embodiment.

Figure 5:
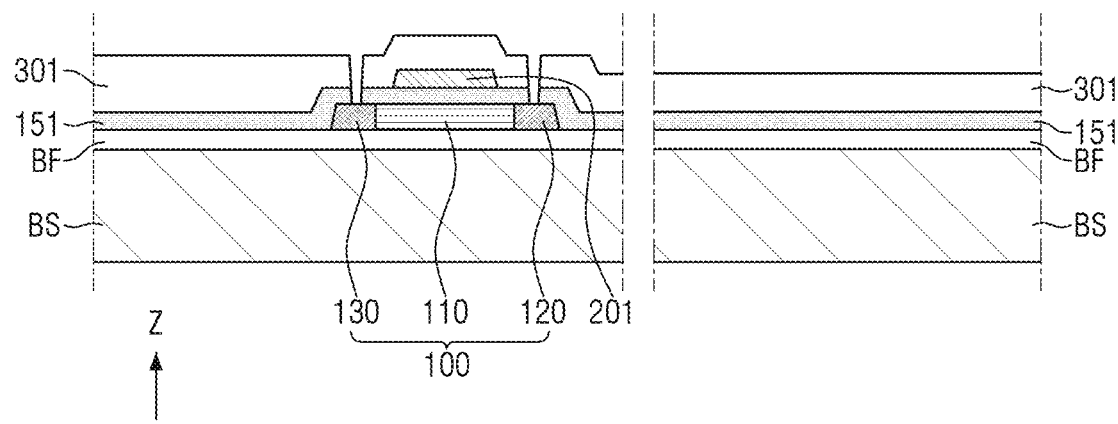
FIGS. 5 through 12 are cross-sectional views illustrating a method of manufacturing a display device according to some example embodiments.

Referring to FIG. 5, a buffer layer BF, a semiconductor material layer 100 including a semiconductor pattern, a gate insulating layer 151, a first conductive layer 201 including a gate pattern, and an interlayer insulating layer 301 are sequentially formed on a base BS. The gate insulating layer 151 and the interlayer insulating layer 301 may be partially patterned to form through holes that partially expose a source region 130 and a drain region 120 of the semiconductor material layer 100. The gate pattern of the first conductive layer 201 may at least partially overlap the semiconductor material layer 100 in the third direction Z. Because the base BS, the buffer layer BF, the semiconductor material layer 100, the gate insulating layer 151, the first conductive layer 201 and the interlayer insulating layer 301 have been described above with reference to FIG. 2, etc., a redundant description thereof is omitted.

Figure 6:
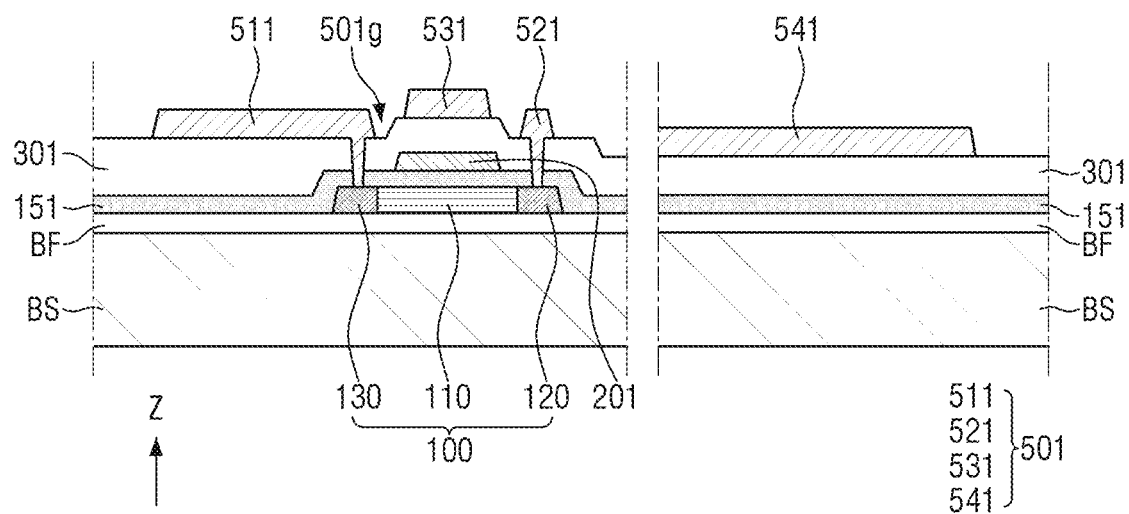

Next, referring to FIGS. 5 and 6, a second conductive layer 501 is formed on the interlayer insulating layer 301. The second conductive layer 501 may be insulated from the first conductive layer 201 by the interlayer insulating layer 301. In an embodiment, the second conductive layer 501 may be formed by forming a conductive metal layer using, e.g., aluminum, molybdenum, copper, titanium or an alloy of these materials and then partially patterning the conductive metal layer. The second conductive layer 501 may be a single layer or may have a laminated structure of different conductive materials. In some embodiments in which the second conductive layer 501 is a single layer, the second conductive layer 501 may include titanium or a titanium alloy. In some embodiments in which the second conductive layer 501 has a laminated structure, a top layer of the second conductive layer 501 may include titanium or a titanium alloy.

The second conductive layer 501 may include a drain pattern 521, a source pattern 511, a capacitor electrode pattern 531, and a pad electrode pattern 541. The drain pattern 521 and the source pattern 511 may be inserted into the through holes formed in the gate insulating layer 151 and the interlayer insulating layer 301 to be electrically connected to the drain region 120 and the source region 130 of the semiconductor material layer 100, respectively. In addition, the capacitor electrode pattern 531 may at least partially overlap the gate pattern of the first conductive layer 201. In addition, the pad electrode pattern 541 may be formed not to overlap the semiconductor material layer 100.

In an embodiment, the second conductive layer 501 may be formed to have a groove 501g. The groove 501g may be formed between the source pattern 511 and the capacitor electrode pattern 531 of the second conductive layer 501 and/or between the capacitor electrode pattern 531 and the drain pattern 521 of the second conductive layer 501. The groove 501g of the second conductive layer 501 may partially expose the surface of the interlayer insulating layer 301.

Next, referring to FIGS. 5 through 7 and 8, an organic layer 600 having a first hole H1 and a second hole H2 is formed on the second conductive layer 501. The first hole H1 and the second hole H2 may partially expose the source pattern 511 and the pad electrode pattern 541 of the second conductive layer 501, respectively.

In an embodiment, the forming of the organic layer 600 having the first hole H1 and the second hole H2 may include applying an organic layer forming composition 650 onto the second conductive layer 501 and partially curing and developing the organic layer forming composition 650 to form the cured organic layer 600 having the first hole H1 and the second hole H2.

Figure 7:
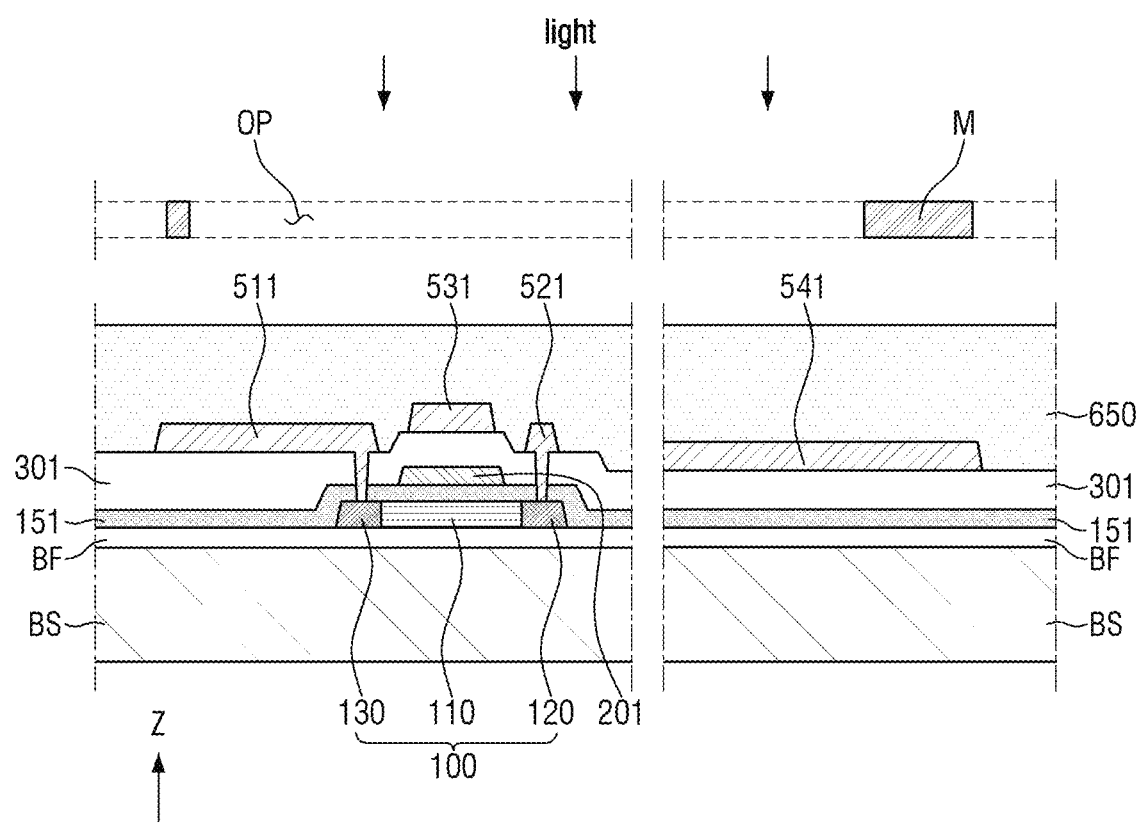

For example, referring to FIG. 7, the organic layer forming composition 650 is applied onto the second conductive layer 501 and is partially exposed and cured using a mask M.

In an embodiment, the organic layer forming composition 650 may include a negative photosensitive material whose portions exposed to light are cured. In addition, the organic layer forming composition 650 may include one or more organic materials selected from an epoxy-based monomer, an imide-based monomer, and a cardo-based monomer. In this case, the organic layer forming composition 650 may be cured mainly at positions corresponding to openings OP of the mask M.

Figure 8:
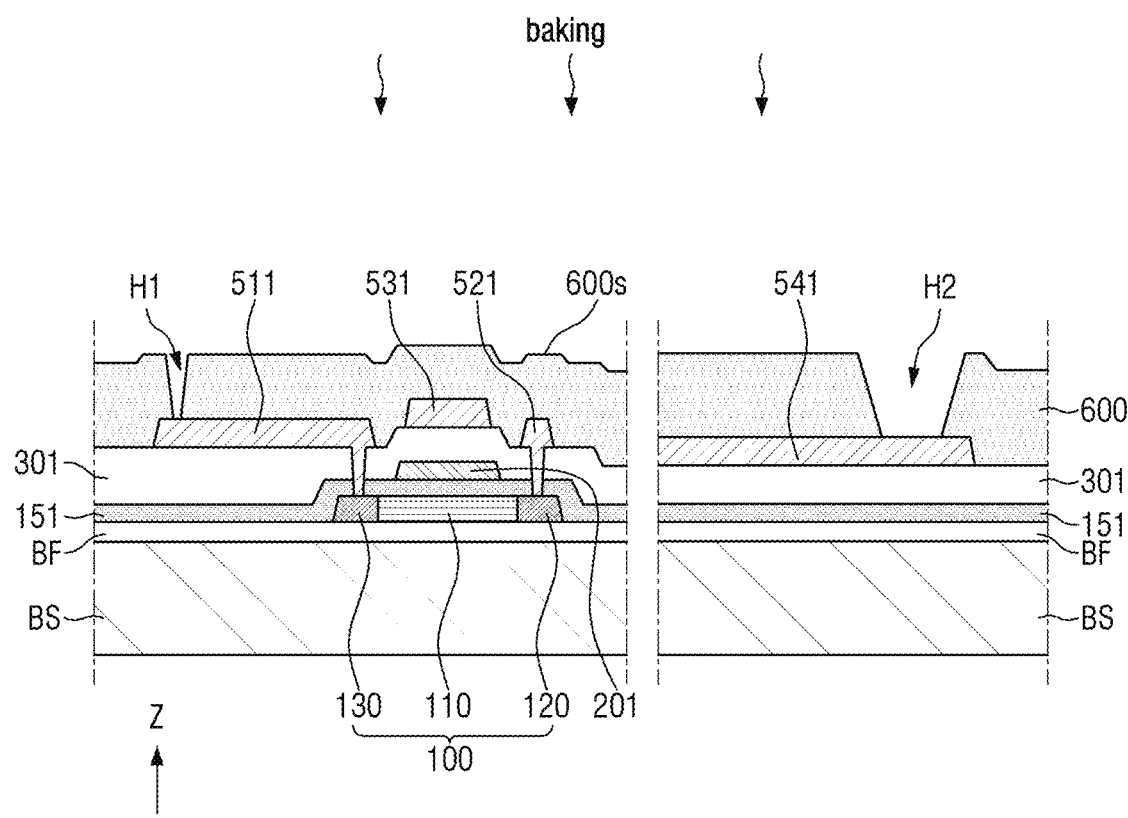
Figure 9:
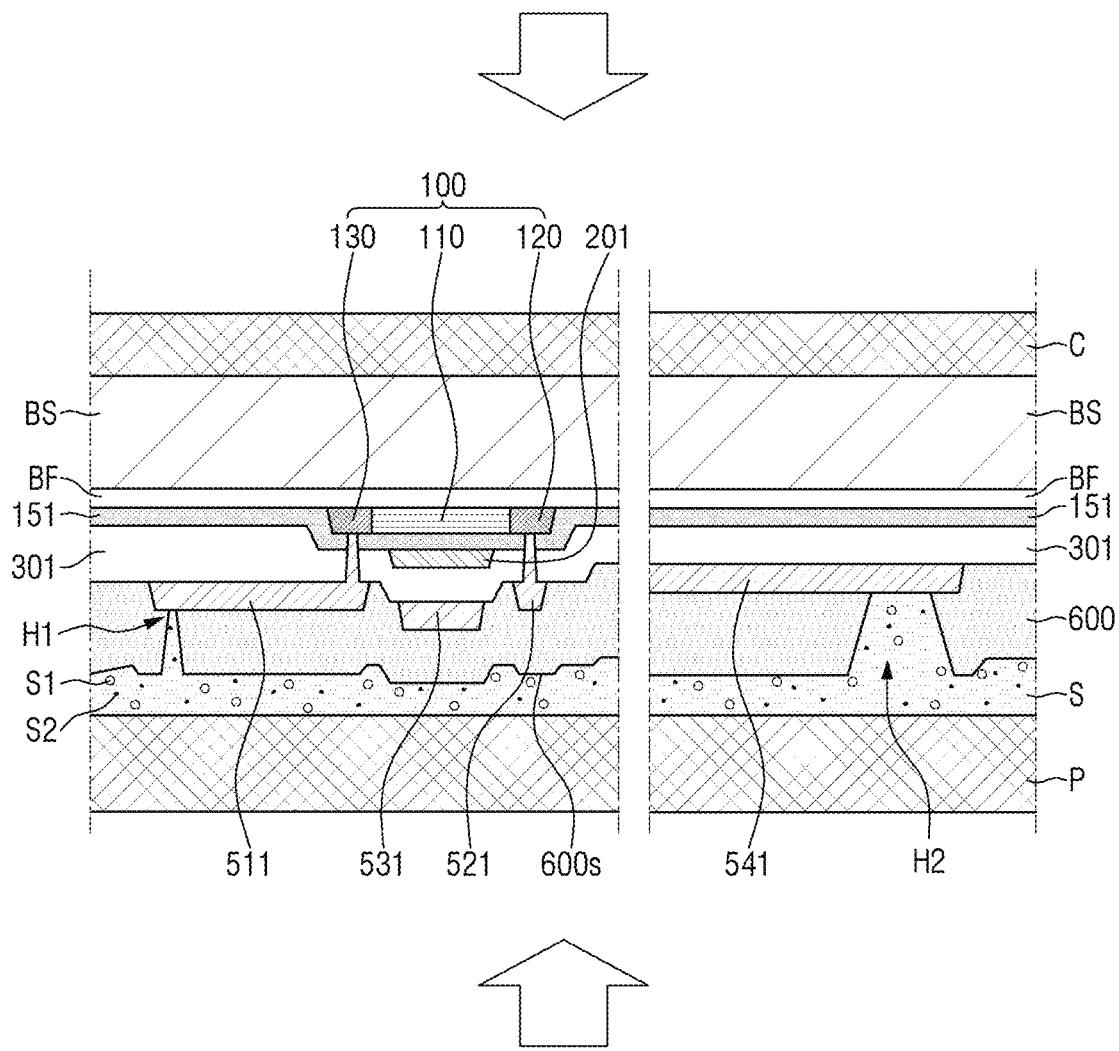

Referring to FIG. 8, the partially cured organic layer forming composition 650 is developed and baked to form the organic layer 600 having the first hole H1 and the second hole H2. In an embodiment in which the organic layer forming composition 650 includes a negative photosensitive material, the first hole H1 and the second hole H2 may be formed at positions corresponding to light shielding regions of the mask M. In another embodiment, the organic layer forming composition 650 may include a positive photosensitive material in which a bond between polymers is at least partially broken at portions exposed to light, and the organic layer forming composition 650 may be cured mainly at positions corresponding to the light shielding portions of the mask M. In this case, the first hole H1 and the second hole H2 may be formed at positions corresponding to the openings of the mask M.

In some embodiments, in the forming of the organic layer 600 having the first hole H1 and the second hole H2, an upper surface of the organic layer 600 may have a rugged uneven surface 600s. The average surface roughness of the uneven surface 600s may be about 200 nm or more or about 250 nm or more. The uneven surface 600s of the organic layer 600 may be caused by a step of the second conductive layer 501, for example, the groove 501g of the second conductive layer 501.

Next, referring to FIGS. 5 through 9, the upper surface (a lower surface in FIG. 9) of the organic layer 600, that is, the uneven surface 600s of the organic layer 600 is partially polished. In an embodiment, the polishing of the uneven surface 600s of the organic layer 600 may include fixing an object to be polished by using a substrate chuck C, preparing a polishing pad P, placing the uneven surface 600s of the organic layer 600 to face the polishing pad P, providing a polishing slurry S between the uneven surface 600s of the organic layer 600 and the polishing pad P, and polishing the uneven surface 600s of the organic layer 600 by using the polishing slurry S and the polishing pad P.

The substrate chuck C may fix an object to be polished. For example, the substrate chuck C may fix the base BS through vacuum suction. In the polishing of the uneven surface 600s of the organic layer 600, vertical pressure may be applied to at least one of the substrate chuck C and the polishing pad P, and at least one of the substrate chuck C and the polishing pad P may rotate in a plane. For example, the substrate chuck C and the polishing pad P may rotate in the same or different directions.

The polishing slurry S may include polishing particles S1 and a polishing aid S2. The polishing particles S1 may directly contact a surface to be polished, for example, the uneven surface 600s of the organic layer 600 and may polish the uneven surface 600s through mechanical action such as friction action. The polishing particles S1 are not particularly limited as long as they are particulate materials capable of exhibiting a polishing effect through mechanical action. Examples of the polishing particles S1 include metal oxide particles such as ceria ($CeO_2$), silica, alumina, titania, zirconia or germania. The average particle size of the polishing particles S1 may be greater than that of the polishing aid S2.

For example, the average particle size of the polishing particles S1 may be about 70 nm to about 120 nm.

The polishing aid S2 may change at least a portion of a surface to be polished to a state easy to be polished through a chemical action with the surface to be polished or change at least a portion of the surface to be polished to a state hard to be polished through a chemical action with the surface to be polished. The polishing aid S2 may include one or more of polyacrylamide, polyacrylic acid, polyaminoether, polyethyleneimine and polyester elastomer.

The content of the polishing aid S2 may be about 0.008% by weight or more, about 0.009% by weight or more, or about 0.010% by weight or more based on the total weight of the polishing slurry S. When the content of the polishing aid S2 is 0.008% by weight or more, the polishing aid S2 can sufficiently reform the surface of the second conductive layer 501 to maximize the polishing selectivity between the organic layer 600 and the second conductive layer 501. An upper limit of the content of the polishing aid S2 is not particularly limited. However, the polishing aid S2 may be contained in an amount of about 1.0% by weight or less in view of miscibility and stability of the polishing slurry S. In some embodiments, the polishing slurry S may further include one or more of an oxidizing agent, a complexing agent, a corrosion inhibitor, and a pH regulator.

In an embodiment, the providing of the polishing slurry S between the uneven surface 600s of the organic layer 600 and the polishing pad P may include bringing the uneven surface 600s of the organic layer 600 into contact with the polishing slurry S and bringing the polishing slurry S into contact with the source pattern 511 and the pad electrode pattern 541 of the second conductive layer 501 which are exposed by the first hole H1 and the second hole H2, respectively.

For example, the polishing aid S2 of the polishing slurry S may reform the surface of the organic layer 600 such that the uneven surface 600s of the organic layer 600 made of an organic material can be easily polished through mechanical action with the polishing particles S1. Accordingly, the organic layer 600 can be polished more efficiently.

In addition, the polishing aid S2 of the polishing slurry S may protect or reform the surface of the second conductive layer 501 such that the exposed surface of the second conductive layer 501 including a metal material such as titanium or a titanium alloy becomes hard to be polished. Therefore, even if the second conductive layer 501 is partially exposed by the first hole H1 and the second hole H2 of the organic layer 600, the uneven surface 600s of the organic layer 600 can be polished without damaging the second conductive layer 501. That is, the polishing selectivity between the organic layer 600 made of an organic material and the second conductive layer 501 made of a metal material can be maximized by chemical action of the polishing aid S2 of the polishing slurry S.

In some embodiments, a lower pH limit of the polishing slurry S may be about 6.0, about 6.1, about 6.2, about 6.3, about 6.4, or about 6.5. Since the pH of the polishing slurry S is about 6.0 or higher, it is possible to prevent ionization, corrosion and/or damage of the second conductive layer 501 including a metal material such as titanium or a titanium alloy. In addition, even if the second conductive layer 501 is partially exposed by the first hole H1 and the second hole H2 of the organic layer 600, the uneven surface 600s of the organic layer 600 can be polished without damaging the second conductive layer 501. An upper pH limit of the polishing slurry S is not particularly limited. However, the upper pH limit of the polishing slurry S may be about 13.5, about 13.0, about 12.5, or about 12.0 in order to prevent damage to the organic layer 600 and the second conductive layer 501.

Figure 10:
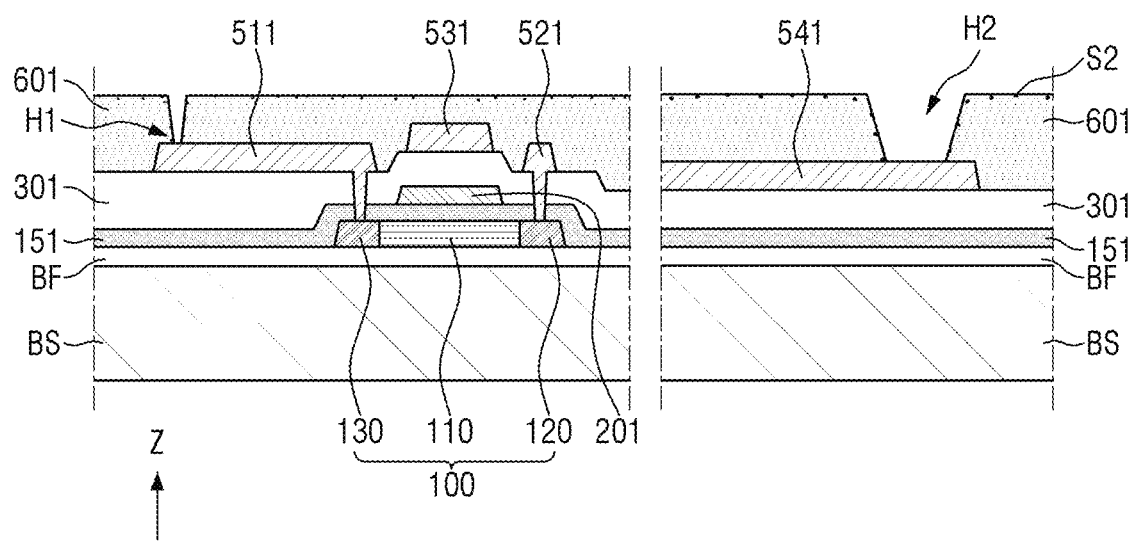
Figure 11:
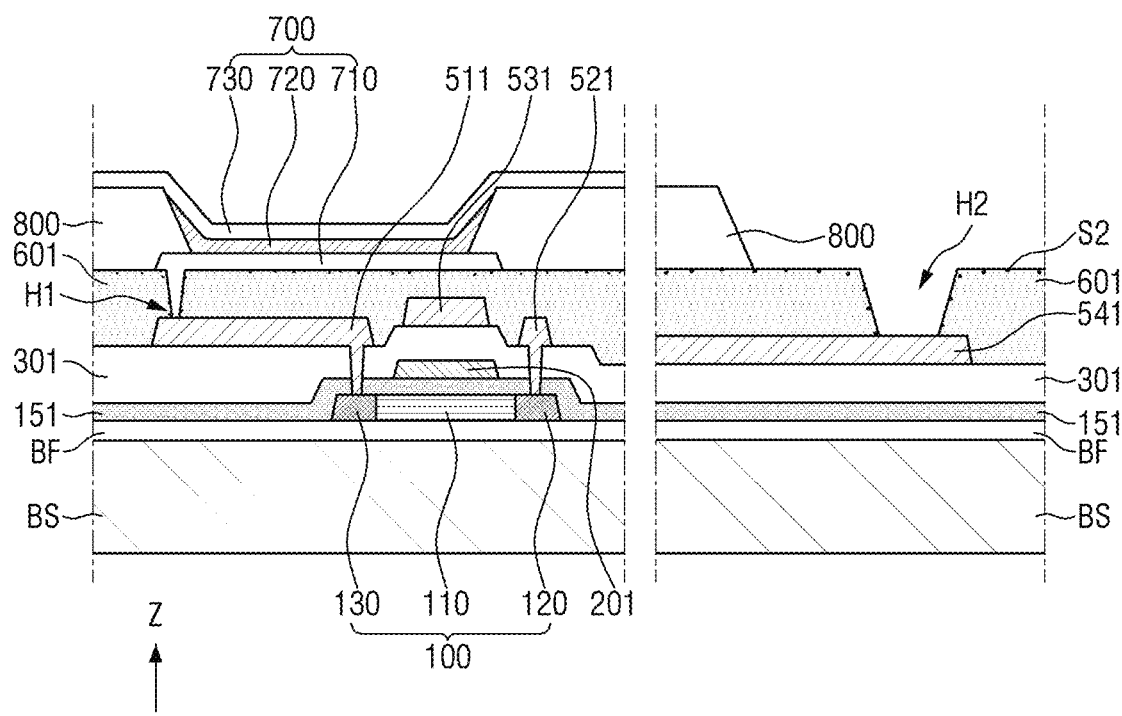
Figure 12:
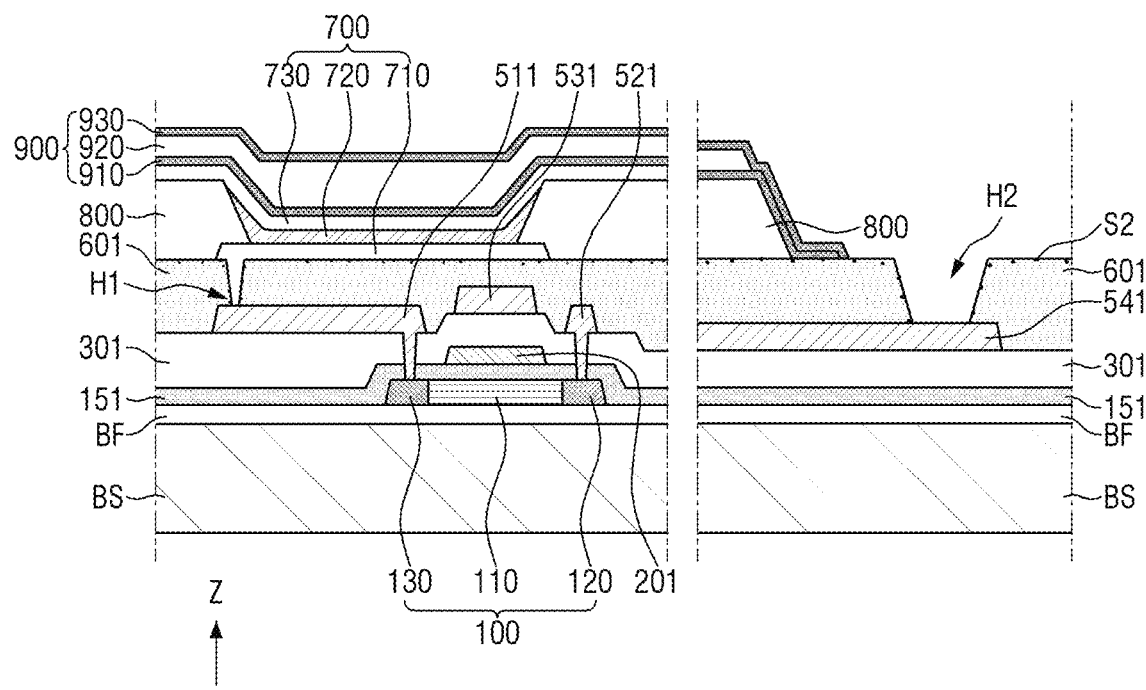

FIG. 10 illustrates the polished upper surface of the organic layer 601. Referring to FIG. 10, the upper surface of the organic layer 601 may have excellent flatness. For example, the surface roughness of the upper surface of the organic layer 601 may be about 50 nm or less, about 40 nm or less, about 30 nm or less, or about 25 nm or less.

In an embodiment, the organic layer 601 after being polished may include the polishing aid S2 partially adsorbed on its surface. For example, the polishing aid S2 may be adsorbed on the surface of an inner wall of the first hole H1 of the organic layer 601 and the surface of an inner wall of the second hole H2. In addition, the polishing aid S2 may be adsorbed on the upper surface of the organic layer 601. The polishing aid S2 adsorbed on the surface of the organic layer 601 may have been adsorbed in the bringing of the polishing slurry S into contact with the organic layer 600, but embodiments are not limited to this case. Because the polishing aid S2 adsorbed on the surface of the organic layer 601 may be the same as the polymer material AP described above with reference to FIG. 2, a redundant description thereof is omitted.

Next, referring to FIGS. 5 through 11, a light emitting element 700 is formed on the organic layer 601. The forming of the light emitting element 700 may include forming an anode 710, forming an organic light emitting layer 720 on the anode 710, and forming a cathode 730 on the organic light emitting layer 720.

In an embodiment, the forming of the anode 710 may be an operation of forming the anode 710 to overlap the groove 501g of the second conductive layer 501 in the third direction Z. In addition, the anode 710 may at least partially overlap the capacitor electrode pattern 531 and the source pattern 511 of the second conductive layer 501.

Because the upper surface of the organic layer 601 is made to have an excellent degree of polarization by at least partially polishing the surface of the organic layer 601 as described above, the thickness of the light emitting element 700 arranged on the organic layer 601, for example, the thickness of the organic light emitting layer 720 can be easily controlled. Accordingly, this can achieve a high-resolution display device, make the luminance of light emitted from the light emitting element 700 more uniform, and prevent a pattern inside the display device from being seen from the outside.

In some embodiments, the method of manufacturing a display device may further include forming a pixel defining layer 800 to partially expose the anode 710 between the forming of the anode 710 and the forming of the organic light emitting layer 720. Since the anode 710, the organic light emitting layer 720, the cathode 730, and the pixel defining layer 800 have been described above with reference to FIG. 2, etc., a redundant description thereof is omitted.

Next, referring to FIGS. 5 through 12, an encapsulation member 900 is formed on the light emitting element 700. The forming of the encapsulation member 900 may include forming a first inorganic encapsulation layer 910, forming an organic encapsulation layer 920, and forming a second inorganic encapsulation layer 930. Since the first inorganic encapsulation layer 910, the organic encapsulation layer 920, and the second inorganic encapsulation layer 930 have been described above with reference to FIG. 2, etc., a redundant description thereof is omitted.

Hereinafter, aspects of methods of manufacturing a display device according to some example embodiments will be described.

FIGS. 13 through 19 are cross-sectional views illustrating a method of manufacturing a display device according to an embodiment.

Figure 13:
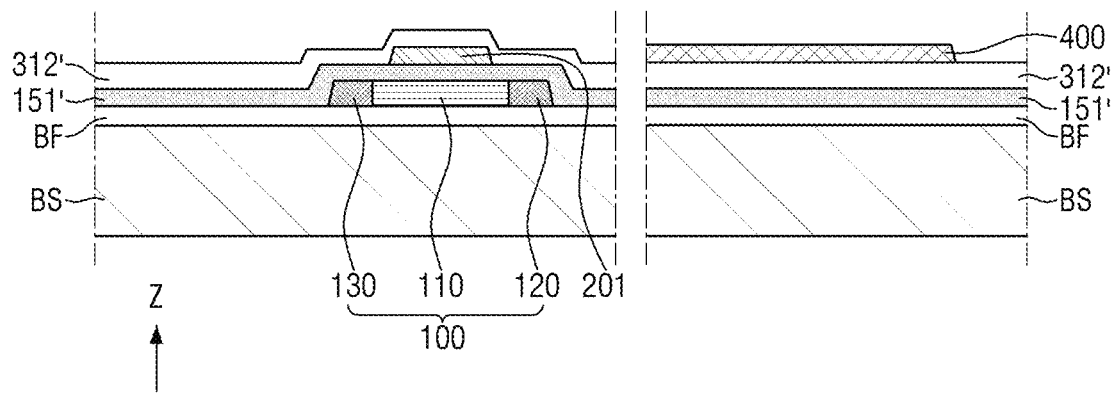
FIGS. 13 through 19 are cross-sectional views illustrating a method of manufacturing a display device according to some example embodiments.

Referring to FIG. 13, a buffer layer BF, a semiconductor material layer 100 including a semiconductor pattern, a gate insulating layer 151', a first conductive layer 201 including a gate pattern, a first interlayer insulating layer 312', and a third conductive layer 400 are sequentially formed on a base BS. In this operation, no through hole may be formed in the gate insulating layer 151' and the first interlayer insulating layer 312', and the semiconductor material layer 100 may be completely covered with the gate insulating layer 151' and the first interlayer insulating layer 312'. The first conductive layer 201 and the third conductive layer 400 may be insulated from each other by the first interlayer insulating layer 312'. In FIG. 13, the third conductive layer 400 is located only in a non-display area. However, embodiments are not limited to this case. In an embodiment, the third conductive layer 400 may also be arranged in a display area to form wirings or auxiliary electrodes necessary for driving a display device. Since the third conductive layer 400 has been described above with reference to FIG. 3, a redundant description thereof is omitted.

Figure 14:
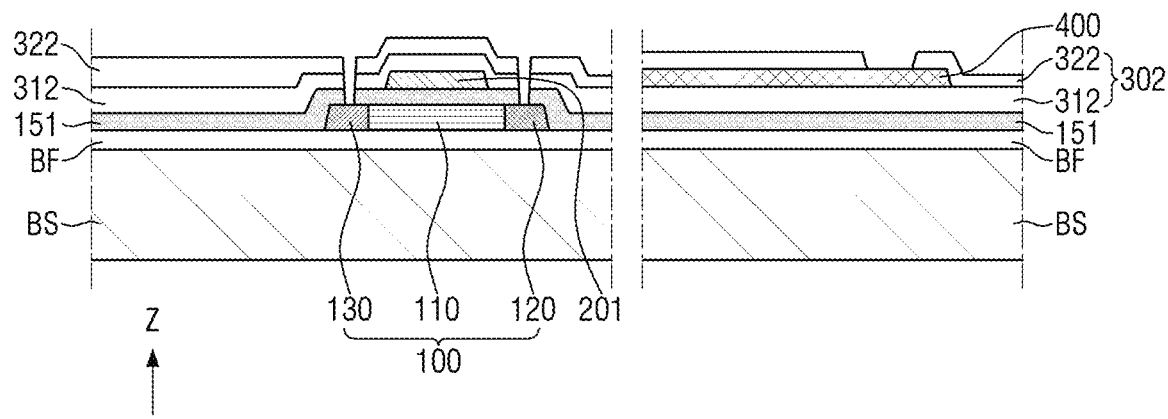

Next, referring to FIGS. 13 and 14, a second interlayer insulating layer 322 is formed on the third conductive layer 400, and through holes partially exposing a source region 130 and a drain region 120 of the semiconductor material layer 100 are formed in the gate insulating layer 151 and the interlayer insulating layer 302. In addition, a hole at least partially exposing the third conductive layer 400 is formed in the second interlayer insulating layer 322.

Figure 15:
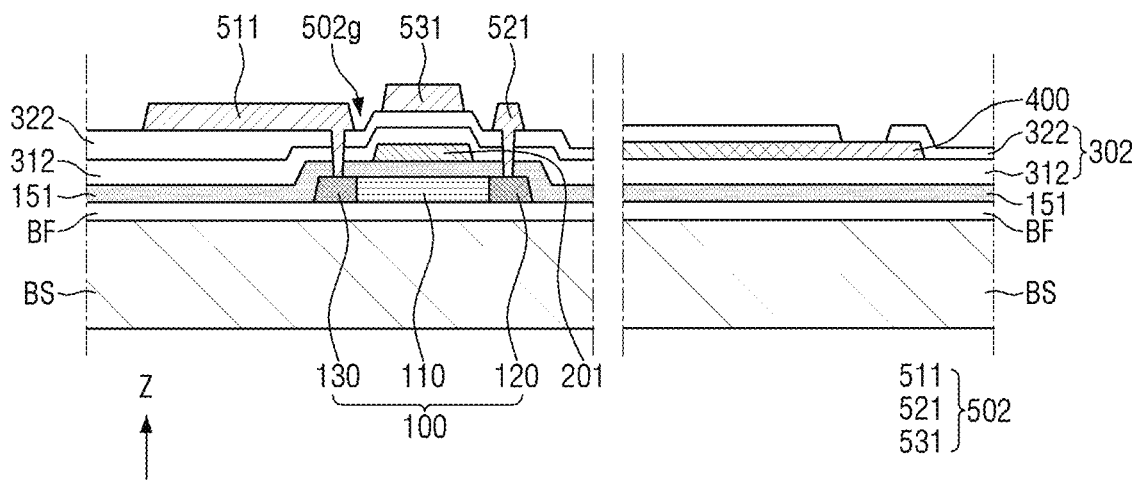
Figure 16:
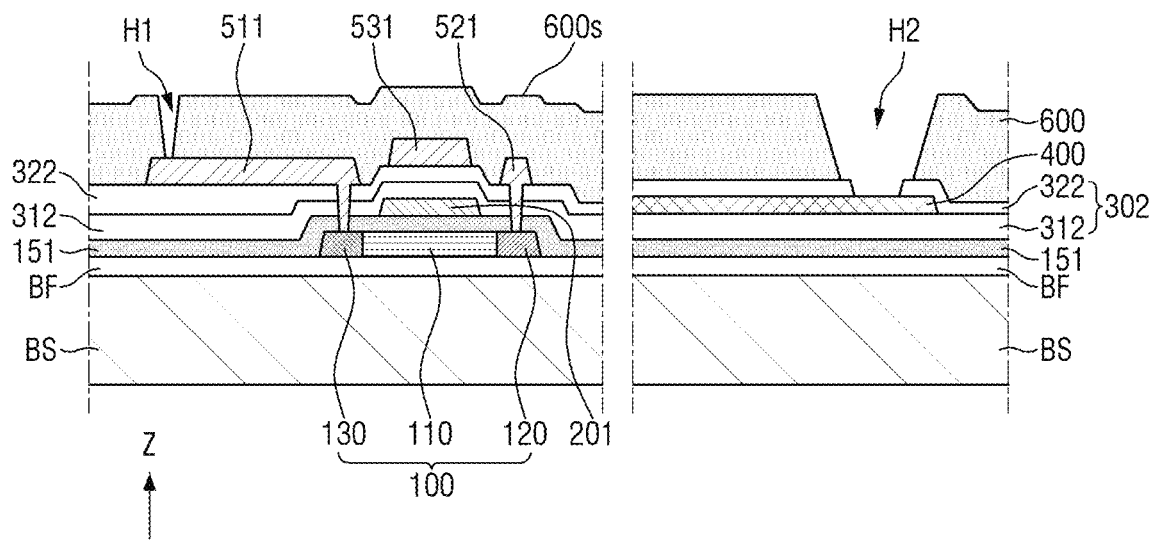
Figure 17:
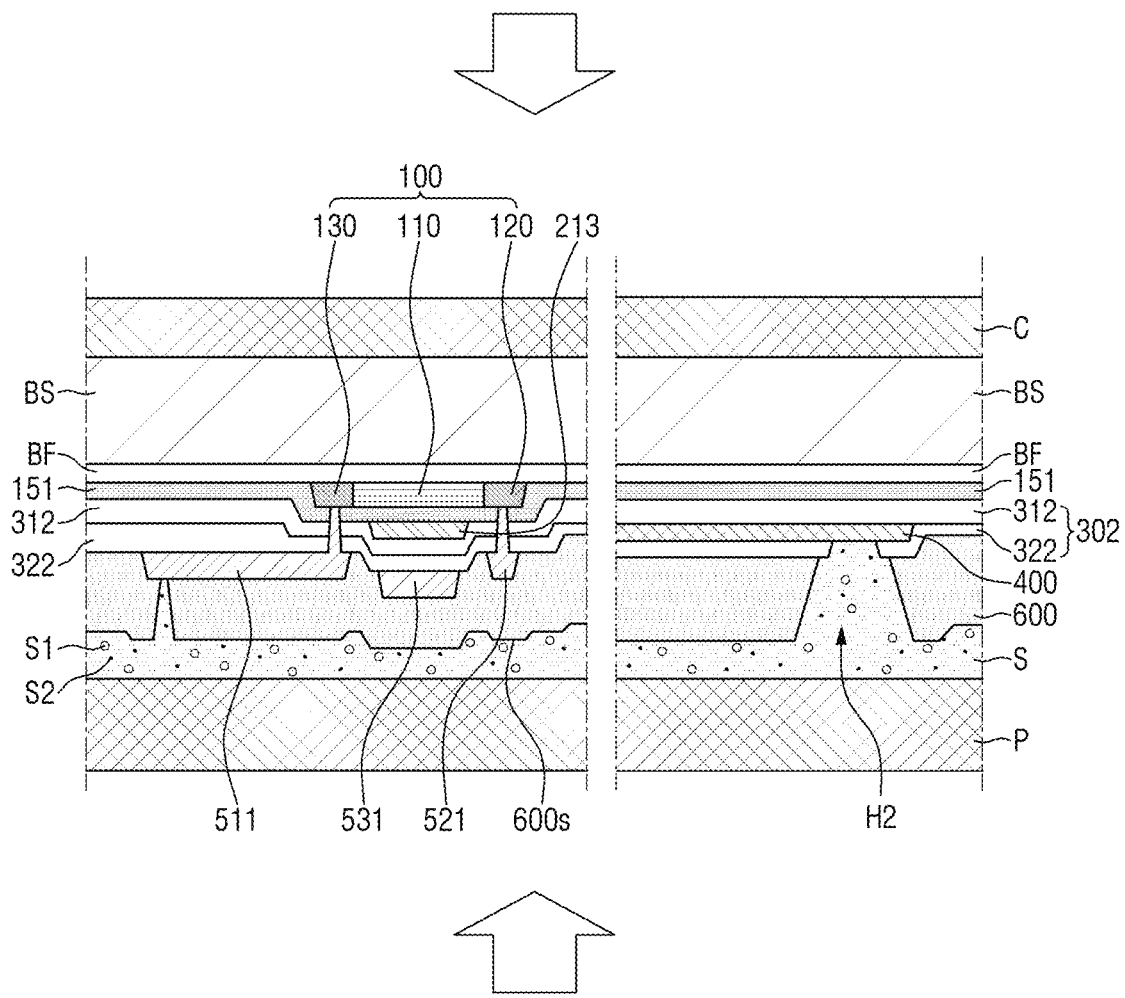

Next, referring to FIGS. 13 through 15, a second conductive layer 502 is formed on the second interlayer insulating layer 322. The third conductive layer 400 and the second conductive layer 502 may be insulated from each other by the second interlayer insulating layer 322. The second conductive layer 502 may have a groove 502g that exposes the surface of the second interlayer insulating layer 322. Because the second conductive layer 502 has been described above, a redundant description thereof is omitted.

Next, referring to FIGS. 13 through 16, an organic layer 600 having a first hole H1 and a second hole H2 and having an uneven surface 600s is formed on the second conductive layer 502. The first hole H1 and the second hole H2 may partially expose a source pattern 511 of the second conductive layer 502 and the third conductive layer 400, respectively. In addition, the uneven surface 600s of the organic layer 600 may be caused by a step of the second conductive layer 502, for example, the groove 502g of the second conductive layer 502.

Next, referring to FIGS. 13 through 17, an upper surface (a lower surface in FIG. 17) of the organic layer 600, that is, the uneven surface 600s of the organic layer 600 is partially polished. The polishing of the uneven surface 600s of the organic layer 600 may include providing a polishing slurry S between the uneven surface 600s of the organic layer 600 and a polishing pad P and polishing the uneven surface 600s of the organic layer 600 by using the polishing pad P.

In an embodiment, the providing of the polishing slurry S between the uneven surface 600s of the organic layer 600 and the polishing pad P may include one or more of bringing the uneven surface 600s of the organic layer 600 into contact with the polishing slurry S, bringing the second interlayer insulating layer 322 into contact with the polishing slurry S, bringing the second conductive layer 502 exposed by the first hole H1 into contact with the polishing slurry S, and bringing the third conductive layer 400 exposed by the second hole H2 into contact with the polishing slurry S.

A polishing aid S2 of the polishing slurry S may protect or reform the surfaces of the second conductive layer 502 and the third conductive layer 400 such that the exposed surfaces of the second conductive layer 502 and the third conductive layer 400 including a metal material such as titanium or a titanium alloy become hard to be mechanically polished by polishing particles S1. Accordingly, even if the second conductive layer 502 and the third conductive layer 400 are partially exposed by the first hole H1 and the second hole H2, the uneven surface 600s of the organic layer 600 can be polished without damaging the second conductive layer 502 and the third conductive layer 400. That is, the polishing selectivity between the organic layer 600 and the second conductive layer 502 and the polishing selectivity between the organic layer 600 and the third conductive layer 400 can be maximized by chemical action of the polishing aid S2 of the polishing slurry S.

Because the polishing slurry S, the polishing particles S1 and the polishing aid S2 have been described above with reference to FIG. 9, a redundant description thereof is omitted.

Figure 18:
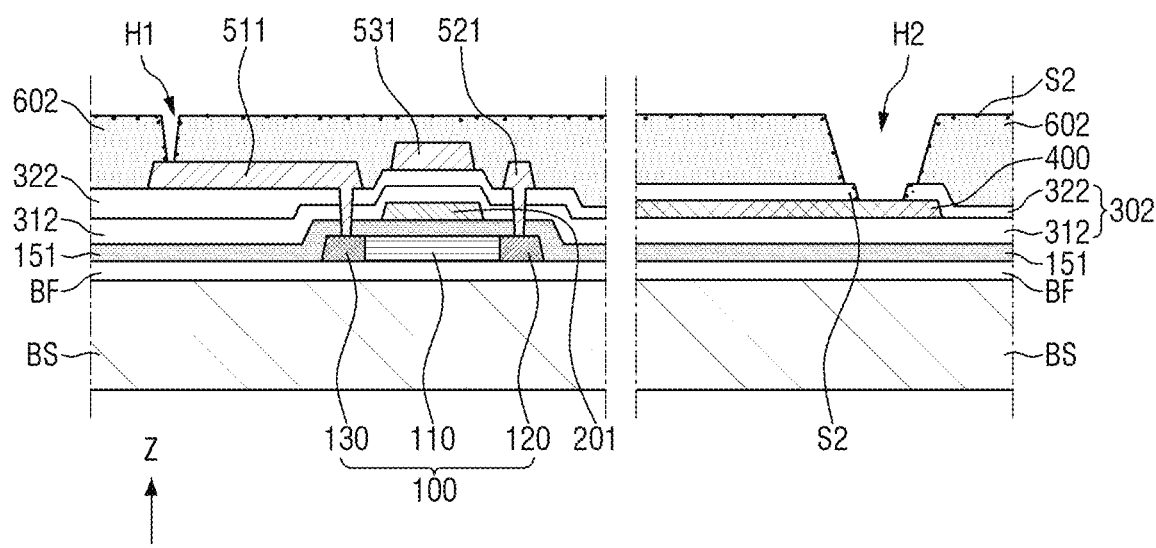
Figure 19:
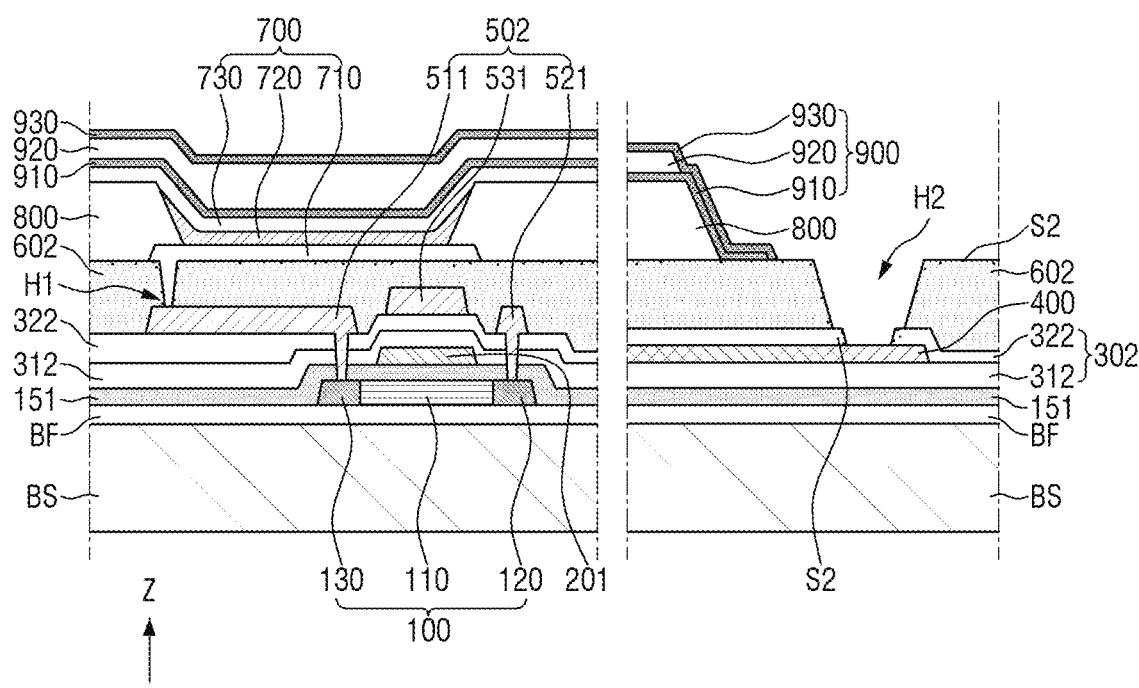

FIG. 18 illustrates the polished upper surface of the organic layer 602. In an embodiment, the organic layer 602 after being polished may include the polishing aid S2 partially adsorbed on its surface. For example, the polishing aid S2 may be adsorbed on the surface of an inner wall of the first hole H1 of the organic layer 602 and the surface of an inner wall of a hole of the organic layer 602 which forms the second hole H2. In addition, the polishing aid S2 may be adsorbed on an inner wall of a hole of the second interlayer insulating layer 322 which forms the second hole H2. When at least a portion of the second interlayer insulating layer 322 is exposed without being covered by the organic layer 602, the polishing aid S2 may also be partially adsorbed on an upper surface of the second interlayer insulating layer 322. In addition, the polishing aid S2 may be adsorbed on the upper surface of the organic layer 602. Because the polishing aid S2 adsorbed on the surfaces of the organic layer 602 and the second interlayer insulating layer 322 may be the same as the polymer material AP described above with reference to FIG. 3, a redundant description thereof is omitted.

Next, referring to FIGS. 13 through 19, a light emitting element 700 and an encapsulation member 900 are sequentially formed on the organic layer 602. Since the light emitting element 700 and the encapsulation member 900 have been described above, a redundant description thereof is omitted.

FIGS. 20 through 26 are cross-sectional views illustrating a method of manufacturing a display device according to some example embodiments.

Figure 20:
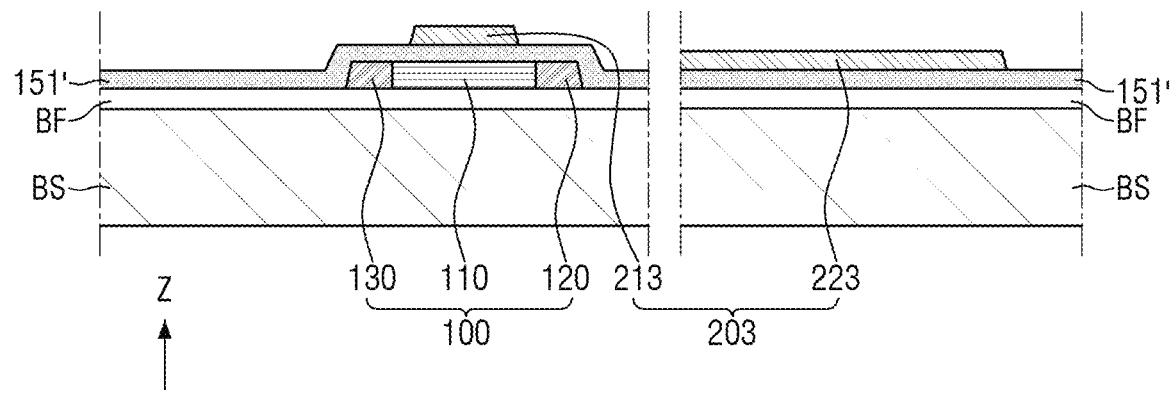
FIGS. 20 through 26 are cross-sectional views illustrating a method of manufacturing a display device according to some example embodiments.

Referring to FIG. 20, a semiconductor material layer 100 including a semiconductor pattern, a gate insulating layer 151', and a conductive layer 203 including a gate pattern 213 and a pad electrode pattern 223 are sequentially formed on a base BS.

Figure 21:
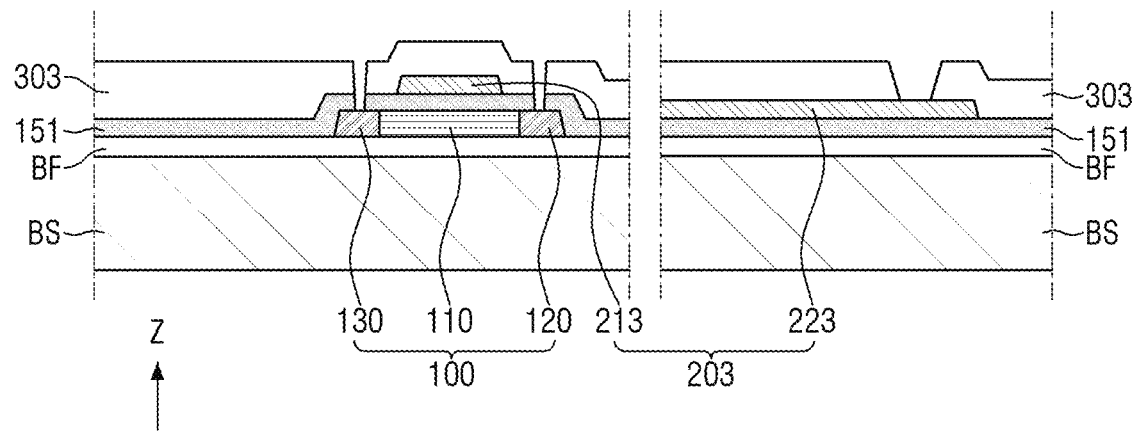

Next, referring to FIGS. 20 and 21, an interlayer insulating layer 303 is formed on the first conductive layer 203. The interlayer insulating layer 303 may have through holes that partially expose a source region 130 and a drain region 120 of the semiconductor material layer 100. In addition, a hole that at least partially exposes the pad electrode pattern 223 of the first conductive layer 203 is formed in the interlayer insulating layer 303.

Figure 22:
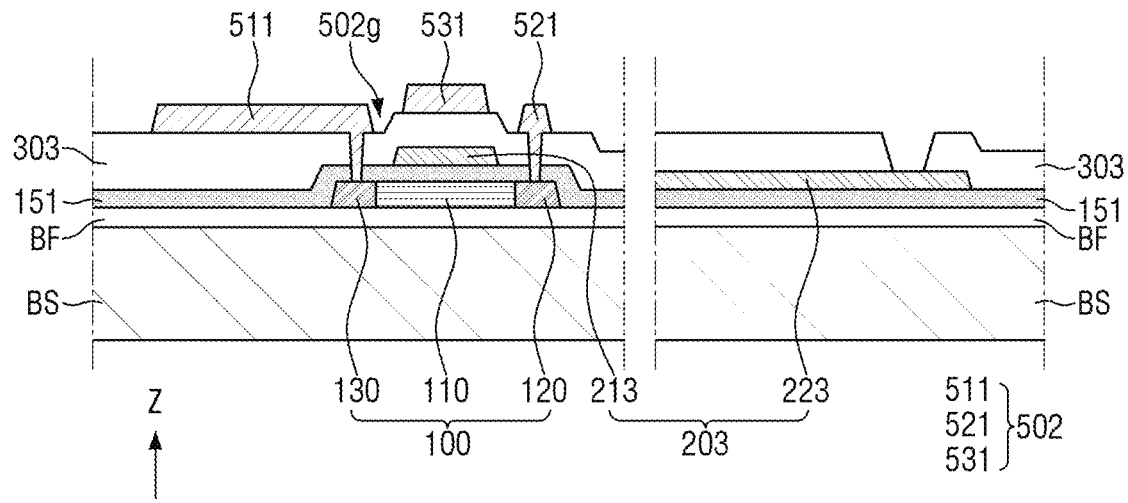
Figure 23:
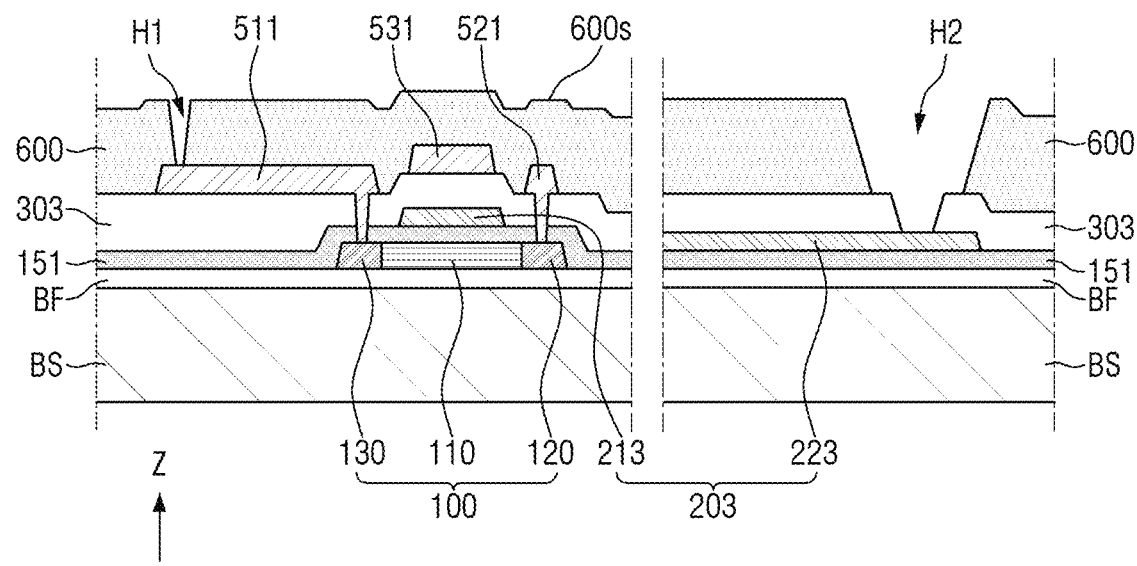
Figure 24:
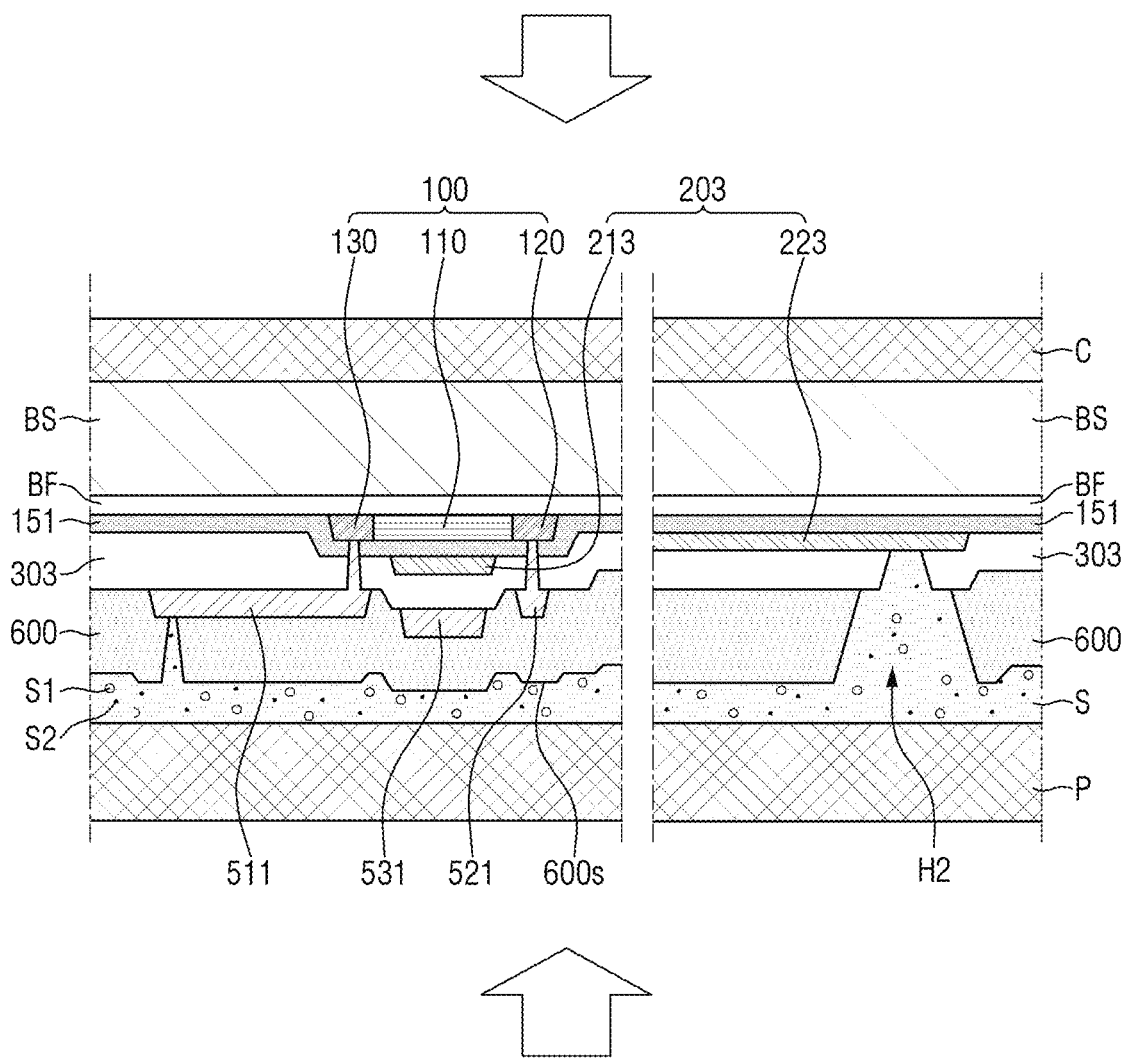

Next, referring to FIGS. 20 through 22, a second conductive layer 502 is formed on the interlayer insulating layer 303. The first conductive layer 203 and the second conductive layer 502 may be insulated from each other by the interlayer insulating layer 303. The second conductive layer 502 may have a groove 502g that exposes the surface of the interlayer insulating layer 303. Since the second conductive layer 502 has been described above, a redundant description thereof is omitted.

Next, referring to FIGS. 20 through 23, an organic layer 600 having a first hole H1 and a second hole H2 and having an uneven surface 600s is formed on the second conductive layer 502. The first hole H1 and the second hole H2 may partially expose a source pattern 511 of the second conductive layer 502 and the pad electrode pattern 223 of the first conductive layer 203, respectively. In addition, the uneven surface 600s of the organic layer 600 may be caused by a step of the second conductive layer 502, for example, the groove 502g of the second conductive layer 502.

Next, referring to FIGS. 20 through 24, an upper surface (a lower surface in FIG. 24) of the organic layer 600, that is, the uneven surface 600s of the organic layer 600 is partially polished. The polishing of the uneven surface 600s of the organic layer 600 may include providing a polishing slurry S between the uneven surface 600s of the organic layer 600 and a polishing pad P and polishing the uneven surface 600s of the organic layer 600 by using the polishing pad P.

In an embodiment, the providing of the polishing slurry S between the uneven surface 600s of the organic layer 600 and the polishing pad P may include one or more of bringing the uneven surface 600s of the organic layer 600 into contact with the polishing slurry S, bringing the interlayer insulating layer 303 into contact with the polishing slurry S, bringing the second conductive layer 502 exposed by the first hole H1 into contact with the polishing slurry S, and bringing the pad electrode pattern 223 of the first conductive layer 203 exposed by the second hole H2 into contact with the polishing slurry S.

A polishing aid S2 of the polishing slurry S may protect or reform the surfaces of the first conductive layer 203 and the second conductive layer 502 such that the exposed surfaces of the first conductive layer 203 and the second conductive layer 502 including a metal material such as titanium or a titanium alloy become hard to be mechanically polished by polishing particles S1. Accordingly, even if the second conductive layer 502 and the first conductive layer 203 are partially exposed by the first hole H1 and the second hole H2, the uneven surface 600s of the organic layer 600 can be polished without damaging the first conductive layer 203 and the second conductive layer 502. That is, the polishing selectivity between the organic layer 600 and the first conductive layer 203 and the polishing selectivity between the organic layer 600 and the second conductive layer 502 can be maximized by chemical action of the polishing aid S2 of the polishing slurry S.

Because the polishing slurry S, the polishing particles S1 and the polishing aid S2 have been described above with reference to FIG. 9, a redundant description thereof is omitted.

Figure 25:
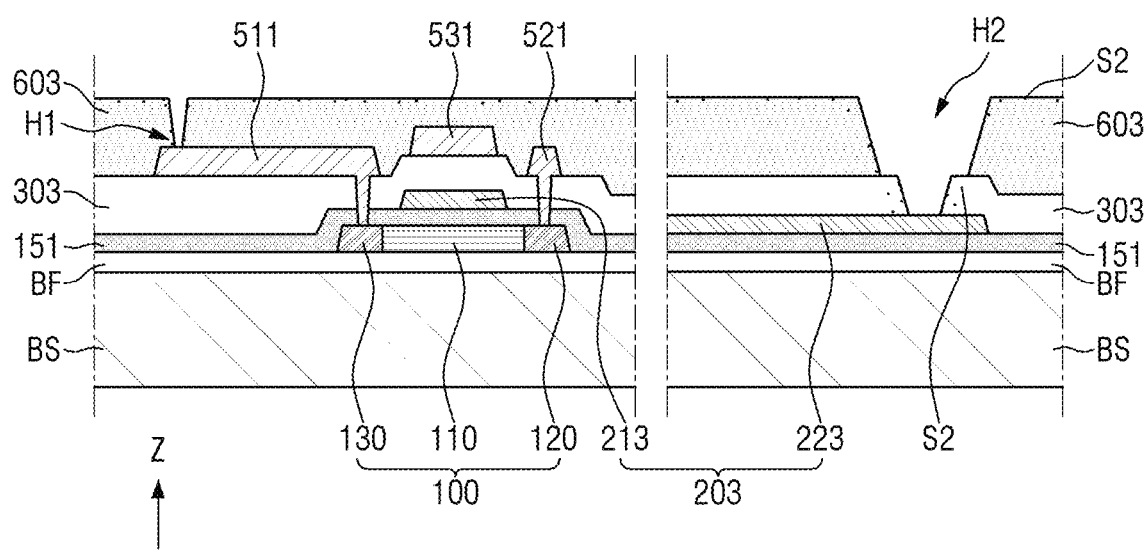
Figure 26:
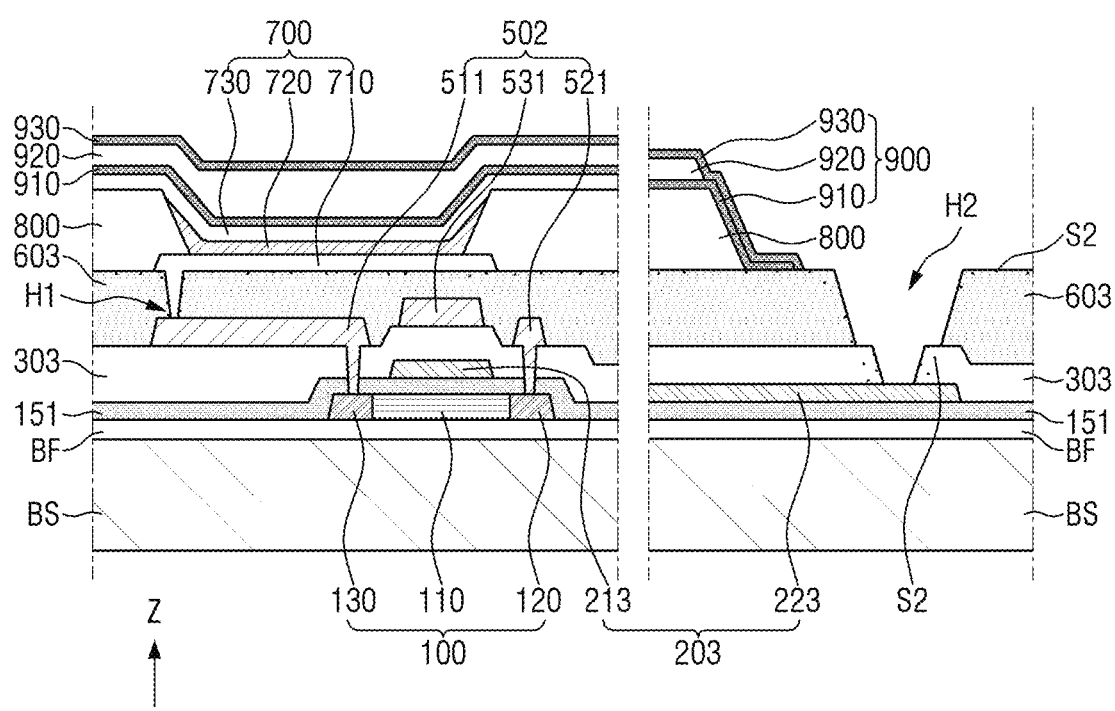

FIG. 25 illustrates the polished upper surface of the organic layer 603. In an embodiment, the organic layer 603 after being polished may include the polishing aid S2 partially adsorbed on its surface. For example, the polishing aid S2 may be adsorbed on the surface of an inner wall of the first hole H1 of the organic layer 603 and the surface of an inner wall of a hole of the organic layer 603 which forms the second hole H2. In addition, the polishing aid S2 may be adsorbed on an inner wall of a hole of the interlayer insulating layer 303 which forms the second hole H2. When at least a portion of the interlayer insulating layer 303 is exposed without being covered by the organic layer 603, the polishing aid S2 may also be partially adsorbed on an upper surface of the interlayer insulating layer 303. In addition, the polishing aid S2 may be adsorbed on the upper surface of the organic layer 603. Because the polishing aid S2 adsorbed on the surfaces of the organic layer 603 and the interlayer insulating layer 303 may be the same as the polymer material AP described above with reference to FIG. 4, a redundant description thereof is omitted.

Referring to FIGS. 20 through 26, a light emitting element 700 and an encapsulation member 900 are sequentially formed on the organic layer 603. Since the light emitting element 700 and the encapsulation member 900 have been described above, a redundant description thereof is omitted.

Hereinafter, aspects of some example embodiments will be described in more detail with reference to Examples, Comparative Examples and Experimental Examples.

Example 1

A buffer layer, a semiconductor material layer, a first conductive layer including a gate pattern, and an interlayer insulating layer were sequentially formed on a base as in FIG. 5 described above. Then, a second conductive layer including a source pattern, a drain pattern, a capacitor electrode pattern and a pad electrode pattern was formed on the interlayer insulating layer as in FIG. 6. The second conductive layer contained titanium. Next, an organic layer having a first hole which partially exposes the source pattern and a second hole which partially exposes the pad electrode pattern was formed on the second conductive layer as in FIGS. 7 and 8. The organic layer contained polyimide resin. Then, an upper surface of the organic layer was polished using a polishing slurry as in FIG. 9. The polishing slurry used in Example 1 contained 0.008% by weight of polyacrylamide as a polishing aid.

Example 2

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.008% by weight of polyacrylic acid was used as a polishing aid of a polishing slurry.

Example 3

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.008% by weight of polyethyleneimine was used as a polishing aid of a polishing slurry.

Example 4

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.008% by weight of polyethylene oxide was used as a polishing aid of a polishing slurry.

Example 5

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.008% by weight of polyvinyl pyrrolidone was used as a polishing aid of a polishing slurry.

Example 6

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.008% by weight of polyvinyl alcohol was used as a polishing aid of a polishing slurry.

Example 7

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that a polymer-based polishing aid was not added to a polishing slurry.

Example 8

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.001% by weight of polyacrylamide was added as a polishing aid of a polishing slurry.

Example 9

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.002% by weight of polyacrylamide was added as a polishing aid of a polishing slurry.

Example 10

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.003% by weight of polyacrylamide was added as a polishing aid of a polishing slurry.

Example 11

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.004% by weight of polyacrylamide was added as a polishing aid of a polishing slurry.

Example 12

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.005% by weight of polyacrylamide was added as a polishing aid of a polishing slurry.

Example 13

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.006% by weight of polyacrylamide was added as a polishing aid of a polishing slurry.

Example 14

A base, a buffer layer, a semiconductor material layer, a gate insulating layer, a first conductive layer, an interlayer insulating layer, a second conductive layer and an organic layer were sequentially formed, and an upper surface of the organic layer was polished in the same manner as in Example 1, except that 0.007% by weight of polyacrylamide was added as a polishing aid of a polishing slurry.

Comparative Example

A base, a buffer layer, a semiconductor material layer, a gate insulating layer, a first conductive layer, an interlayer insulating layer, a second conductive layer and an organic layer were formed in the same manner as in Example 1, except that an upper surface of the organic layer was not polished.

Experimental Example 1: Measurement of
Polishing Rate of a Conductive Layer According to
Type of a Polishing Aid The polishing rate of a titanium conductive layer (a second conductive layer) exposed by a first hole and a second hole was measured in the process of performing polishing according to Examples 1 through 7, and the results are shown in FIG. 27.

Figure 27:
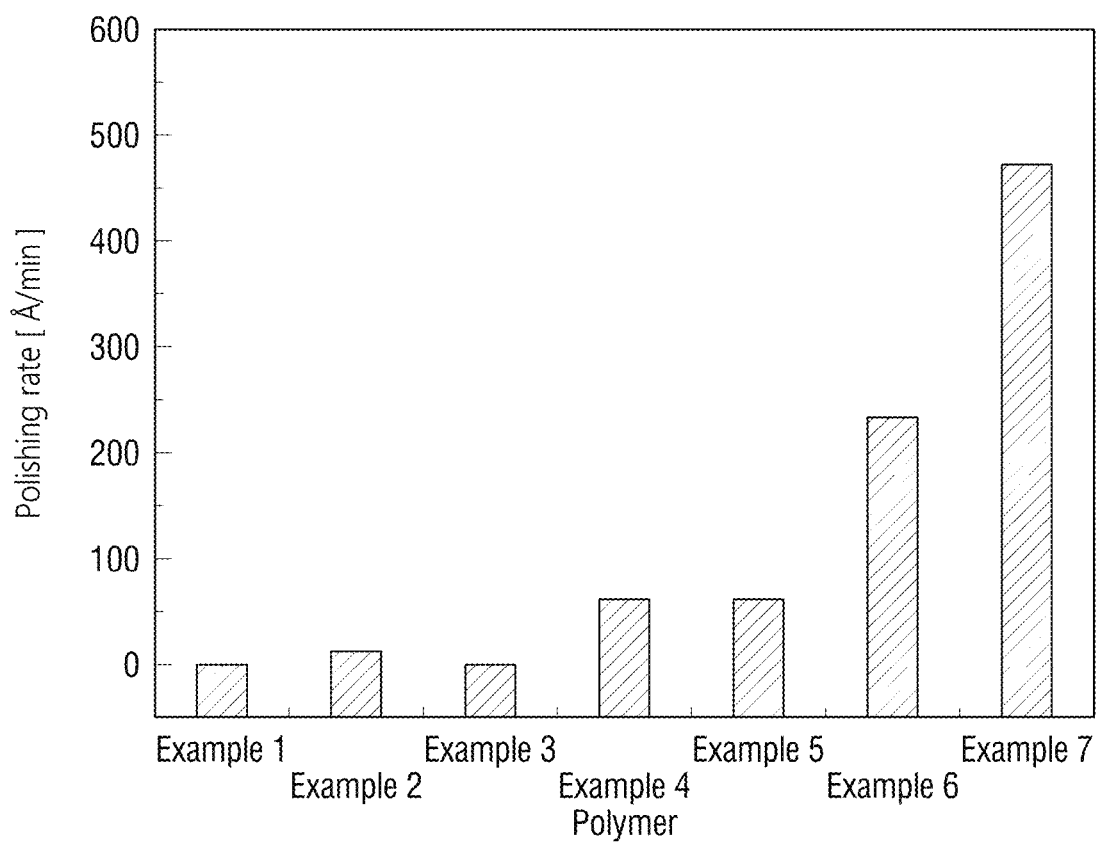
FIG. 27 is a graph illustrating the results of an Experimental Example 1.

Referring to FIG. 27, it can be seen that, in the case of Examples 1 through 3 using polyacrylamide, polyacrylic acid and polyaminoether as polishing aids, the titanium conductive layer (the second conductive layer) is hardly polished even if an organic layer is sufficiently polished using a polishing slurry. That is, although the polishing slurry simultaneously contacts the organic layer containing polyimide and the second conductive layer containing titanium, the second conductive layer can maintain its initial patterned state without being damaged, whereas the organic layer is polished by mechanical action and/or chemical action with excellent efficiency.

On the other hand, in the case of Examples 4 through 6 using polyethylene oxide, polyvinyl pyrrolidone and polyvinyl alcohol as polishing aids, the degree of polishing of the titanium conductive layer (the second conductive layer) is relatively greater than in Examples 1 through 3.

In the case of Example 7 in which a polymer material was not added as a polishing aid, the degree of polishing of the titanium conductive layer (the second conductive layer) is relatively far greater than in Examples 1 through 6.

Experimental Example 2: Measurement of Polishing Rate of a Conductive Layer According to Polishing Aid Content The polishing rate of a titanium conductive layer (a second conductive layer) exposed by a first hole and a second hole was measured in the process of performing polishing according to Examples 1 and 7 through 14, and the results are shown in FIG. 28.

Figure 28:
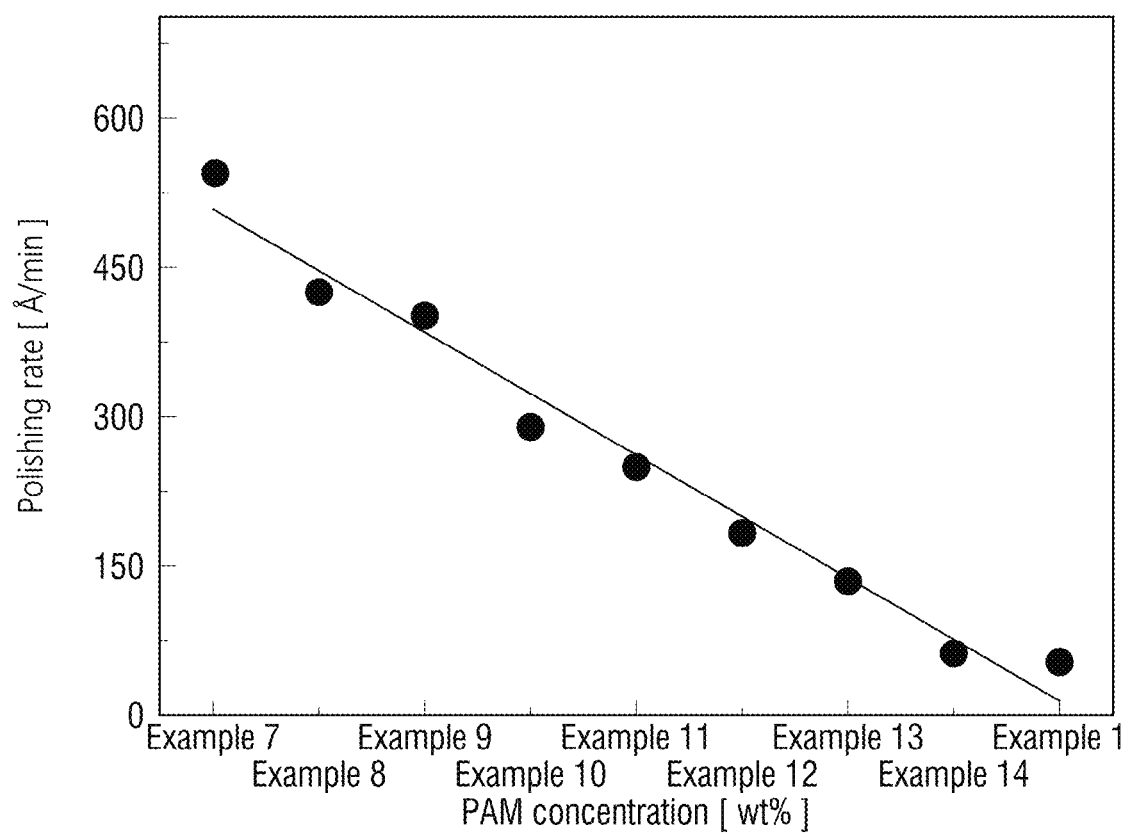
FIG. 28 is a graph illustrating the results of an Experimental Example 2.

Referring to FIG. 28, it can be seen that as polyacrylamide content in a polishing slurry increases, the degree to which the titanium conductive layer (the second conductive layer) is polished gradually decreases. In addition, when the polyacrylamide content in the polishing slurry is about 0.008% by weight or more, the titanium conductive layer is hardly polished. That is, when polyacrylamide is sufficiently contained in the polishing slurry, even if the polishing slurry simultaneously contacts an organic layer containing polyimide and the second conductive layer containing titanium, the second conductive layer is not damaged while the organic layer is polished by mechanical action and/or chemical action with excellent efficiency.

Experimental Example 3: Measurement of Step Profile of an Organic Layer with or without a Polishing Process The step profile of an upper surface of an organic layer polished according to Example 1 was measured. In addition, the step profile of an upper surface of an organic layer unpolished according to Comparative Example was measured, and the results are shown in FIG. 29.

Figure 29:
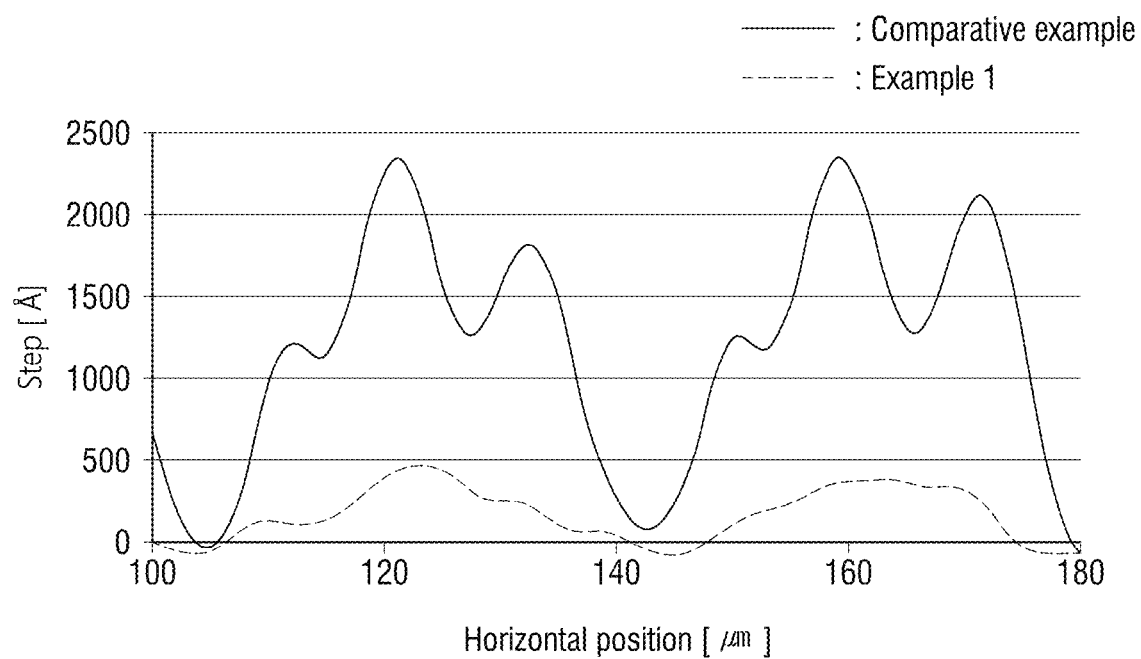
FIG. 29 is a graph illustrating the results of an Experimental Example 3.

Referring to FIG. 29, it can be seen that the flatness of the organic layer is remarkably improved by polishing the upper surface of the organic layer using a polishing slurry. Specifically, the average surface roughness of the upper surface of the organic layer polished according to Example 1 was about 21 nm, whereas the average surface roughness of the upper surface of the organic layer unpolished according to Comparative Example was about 217 nm. That is, it can be seen that the average surface roughness is reduced to about 9.6% or less by polishing the surface of the organic layer using the polishing slurry.

Figure 30:
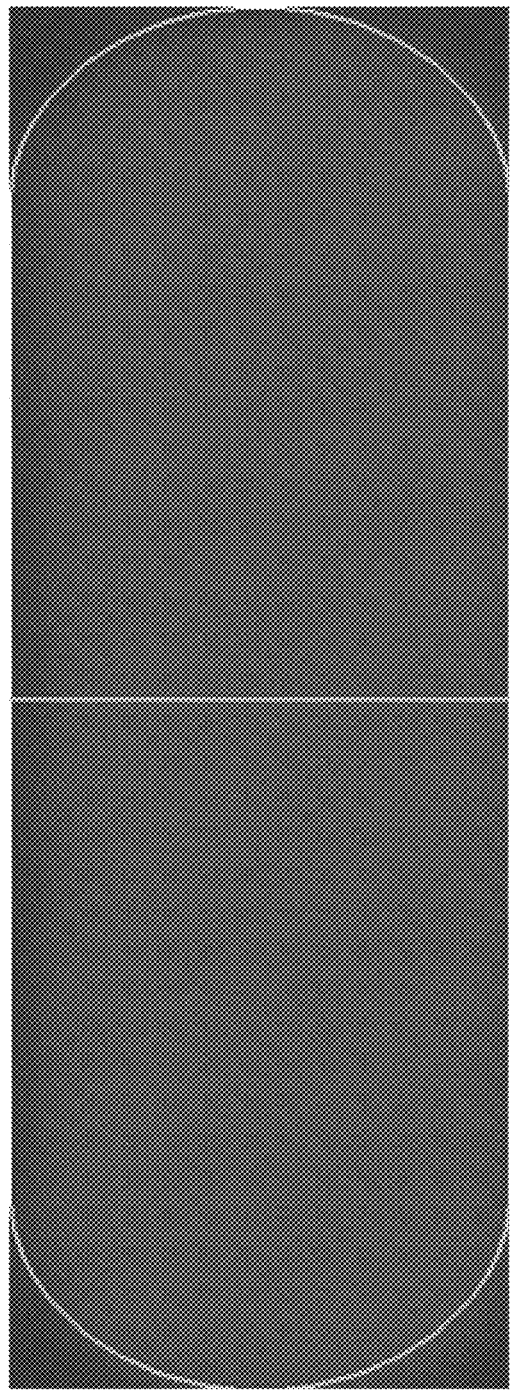
FIG. 30 is an image showing the light emission state of a light emitting element according to Example 1.

Experimental Example 4: Measurement of Light Emission State of a Light Emitting Element with or without a Polishing Process A blue organic light emitting element was formed on an organic layer polished according to Example 1 through an inkjet process to simulate a blue pixel of an organic light emitting display. Then, the light emission state of the organic light emitting element was measured, and an image of the light emission state of the organic light emitting element is shown in FIG. 30. In addition, a blue organic light emitting element was formed on an organic layer unpolished according to Comparative Example through an inkjet process to simulate a blue pixel of an organic light emitting display. Then, the light emission state of the organic light emitting element was measured, and an image of the light emission state of the organic light emitting element is shown in FIG. 31.

Referring to FIG. 30, it can be seen that if the organic light emitting element is placed on the organic layer after an upper surface of the organic layer is polished according to Example 1 to have an average surface roughness of about 21 nm, the luminance of light emitted from the light emitting element is substantially uniform within one pixel defined by a pixel defining layer.

Figure 31:
FIG. 31 is an image showing the light emission state of a light emitting element according to a Comparative Example.

On the other hand, referring to FIG. 31, it can be seen that if the organic light emitting element is placed on the organic layer having an average surface roughness of about 217 nm according to Comparative Example, a plurality of regular patterns or stains are observed within one pixel defined by a pixel defining layer. This may be because the organic light emitting element is affected by the surface roughness of an uneven upper surface of the organic layer. Specifically, the regular patterns or stains seen from the outside may be, but are not limited to, steps formed by wirings and/or electrodes under the organic layer.

In a method of manufacturing a display device according to an embodiment, the surface of an organic layer which provides a space in which a light emitting element can be arranged is polished to improve the flatness of the organic layer. Therefore, the thickness of an organic light emitting element can be controlled easily, and a display device with improved quality can be provided.

However, the effects of the embodiments are not restricted to the one set forth herein. The above and other effects of the embodiments will become more apparent to one of daily skill in the art to which the embodiments pertain by referencing the claims.

While aspects of some example embodiments of the present invention have been illustrated and described with reference to example embodiments thereof, it will be understood by those of ordinary skill in the art that various changes in form and detail may be made therein without departing from the spirit and scope of the present invention as defined by the following claims and their equivalents. The example embodiments should be considered in a descriptive sense only and not for purposes of limitation.

What is claimed is:

1. A display device comprising:
   a base;
   a first conductive layer on the base;
   an organic layer on the first conductive layer and having a hole exposing the first conductive layer;
   a light emitting element on the organic layer; and
   a polymer material which is partially adsorbed on a surface of the organic layer,
   wherein the polymer material comprises one or more of polyacrylamide, polyacrylic acid, polyaminoether, polyethyleneimine and polyester elastomer.

2. The display device of claim 1, wherein the polymer material is adsorbed on a surface of an inner wall of the hole of the organic layer.

3. The display device of claim 2, further comprising an insulating layer between the first conductive layer and the organic layer and made of an inorganic material,
   wherein the insulating layer has a hole which partially exposes the first conductive layer and is connected to the hole of the organic layer, and
   the polymer material is further adsorbed on a surface of an inner wall of the hole of the insulating layer.

4. The display device of claim 3, further comprising:
a semiconductor material layer which is disposed between the base and the first conductive layer; and
a second conductive layer which is disposed between the insulating layer and the organic layer,
wherein the second conductive layer is electrically connected to the light emitting element and the semiconductor material layer.

5. The display device of claim 1, wherein the light emitting element comprises:
an anode which is directly disposed on the organic layer and is inserted into the hole of the organic layer to be electrically connected to the first conductive layer;
a cathode which is disposed on the anode; and
an organic light emitting layer between the anode and the cathode,
wherein the anode inserted into the hole contacts the surface of the organic layer on which the polymer material is adsorbed.

* * * * *